United States Patent
Al-Malki et al.

(10) Patent No.: US 12,292,543 B2
(45) Date of Patent: May 6, 2025

(54) METHOD AND SYSTEM FOR DETERMINING PERMEABILITY AND LOST CIRCULATION

(71) Applicant: SAUDI ARABIAN OIL COMPANY, Dhahran (SA)

(72) Inventors: Mohammed Ali Al-Malki, Dhahran (SA); Mahmoud F. Abughaban, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 195 days.

(21) Appl. No.: 17/174,625

(22) Filed: Feb. 12, 2021

(65) Prior Publication Data

US 2022/0260746 A1    Aug. 18, 2022

(51) Int. Cl.
*G01V 5/04* (2006.01)
*G01V 20/00* (2024.01)
*G06F 30/12* (2020.01)

(52) U.S. Cl.
CPC .............. *G01V 5/045* (2013.01); *G01V 20/00* (2024.01); *G06F 30/12* (2020.01)

(58) Field of Classification Search
CPC .................. G01V 5/045; G01V 99/005; G01V 2210/6244; G01V 2210/6246;
(Continued)

(56) References Cited

U.S. PATENT DOCUMENTS 5,063,776 A    11/1991  Zanker et al.
6,115,671 A *  9/2000  Fordham ................. G06F 19/00
                                                            702/8
(Continued)

FOREIGN PATENT DOCUMENTS

CN    102839934 A   12/2012
CN    101899969 B    4/2013
(Continued)

OTHER PUBLICATIONS

"Permeability estimation with NMR logging", PetroWiki, Glenda Smith; Mar. 27, 2013, https://petrowiki.spe.org/Permeability_estimation_with_NMR_logging; https://petrowiki.spe.org/File:Vol5_Page_0323_Image_0001.png (Year: 2013).*

(Continued)

*Primary Examiner* — Catherine T. Rastovski
*Assistant Examiner* — Lal C Mang
(74) *Attorney, Agent, or Firm* — Osha Bergman Watanabe & Burton LLP

(57) ABSTRACT

A method may include obtaining first nuclear magnetic resonance (NMR) data and acquired permeability data regarding a geological region of interest. The method may further include determining, using a neural network and second NMR data, predicted permeability data regarding a predetermined formation within the geological region of interest. The neural network may be trained using the first NMR data and the acquired permeability data. The method may further include determining a predetermined fracture size within the predetermined formation based on the predicted permeability data. The method may further include determining a predetermined type of lost circulation material (LCM) based on the predetermined fracture size. The method may further include transmitting a command to a well system that triggers a well operation using the predetermined type of LCM.

15 Claims, 11 Drawing Sheets

(58) Field of Classification Search
CPC ...... G01V 2210/646; G01V 3/38; G01V 3/32; G06F 30/12
See application file for complete search history.

(56) References Cited

U.S. PATENT DOCUMENTS

| | | | |
|---|---|---|---|
| 6,357,536 | B1 | 3/2002 | Schrader et al. |
| 10,449,477 | B2 | 10/2019 | Johnson et al. |
| 10,487,603 | B2 | 11/2019 | Manwill et al. |
| 2002/0010548 | A1 | 1/2002 | Tare et al. |
| 2003/0052673 | A1 | 3/2003 | Speier et al. |
| 2009/0188718 | A1 | 7/2009 | Kaageson-Loe et al. |
| 2009/0250264 | A1 | 10/2009 | Dupriest |
| 2010/0026293 | A1 | 2/2010 | Minh |
| 2011/0174541 | A1 | 7/2011 | Strachan et al. |
| 2013/0080066 | A1* | 3/2013 | Al-Dossary ............ G01V 1/282 702/11 |
| 2013/0299241 | A1 | 11/2013 | Alberty et al. |
| 2014/0326449 | A1 | 11/2014 | Samuel et al. |
| 2014/0341455 | A1* | 11/2014 | Minh ........................ G01V 3/14 382/131 |
| 2015/0211350 | A1 | 7/2015 | Norman et al. |
| 2015/0292323 | A1 | 10/2015 | Shahri et al. |
| 2015/0300151 | A1 | 10/2015 | Mohaghegh |
| 2016/0053604 | A1 | 2/2016 | Abbassian et al. |
| 2016/0080066 | A1 | 3/2016 | Alamouti et al. |
| 2016/0231450 | A1* | 8/2016 | Shao ........................ G01V 3/32 |
| 2016/0370492 | A1 | 12/2016 | Chen et al. |
| 2017/0044896 | A1 | 2/2017 | Salminen |
| 2017/0075004 | A1 | 3/2017 | McColpin et al. |
| 2017/0176228 | A1 | 6/2017 | Elisabeth |
| 2017/0191919 | A1 | 7/2017 | Kulkarni et al. |
| 2018/0003045 | A1 | 1/2018 | Dotson et al. |
| 2018/0012384 | A1 | 1/2018 | Marland et al. |
| 2018/0037797 | A1* | 2/2018 | Brady ..................... C09K 8/426 |
| 2018/0106147 | A1 | 4/2018 | Lakings et al. |
| 2018/0127632 | A1* | 5/2018 | Amanullah ............ C09K 8/506 |
| 2018/0266197 | A1* | 9/2018 | Amanullah ............. E21B 49/08 |
| 2018/0335530 | A1* | 11/2018 | Wu ......................... G01V 1/362 |
| 2019/0094119 | A1 | 3/2019 | Singh et al. |
| 2019/0178770 | A1 | 6/2019 | Marum et al. |
| 2019/0316457 | A1 | 10/2019 | Al-Rubaii et al. |
| 2020/0270958 | A1 | 8/2020 | Omrani et al. |
| 2020/0355839 | A1* | 11/2020 | Jeong ....................... G01V 1/50 |
| 2020/0362694 | A1 | 11/2020 | Al-Rubaii et al. |
| 2020/0362695 | A1 | 11/2020 | Al-Rubaii et al. |
| 2020/0370381 | A1 | 11/2020 | Al-Rubaii et al. |
| 2020/0370426 | A1* | 11/2020 | Dugas ................. E21B 41/0085 |
| 2020/0371495 | A1 | 11/2020 | Al-Rubaii et al. |

FOREIGN PATENT DOCUMENTS

| | | |
|---|---|---|
| WO | 2010054476 A1 | 5/2010 |
| WO | 2015/072962 A1 | 5/2015 |
| WO | 2015191091 A1 | 12/2015 |
| WO | 2018208634 A1 | 11/2018 |
| WO | 2020139415 A1 | 7/2020 |
| WO | 2020142073 A1 | 7/2020 |

OTHER PUBLICATIONS

"Downhole Applications of Magnetic Sensors", Chinthaka P. Gooneratne, MDPI, sensor, published: Oct. 19, 2017, https://www.ncbi.nlm.nih.gov/pmc/articles/PMC5676656/pdf/sensors-17-02384.pdf (Year: 2017).*

Ofei, Titus Ntow, "Effect of Yield Power Law Fluid Rheological Properties on Cuttings Transport in Eccentric Horizontal Narrow Annulus", Journal of Fluids, Hindawi Publishing Corporation, vol. 2016, Article ID 4931426, 2016, pp. 1-10 (10 pages).

Robinson, Leon and Mark Morgan, "Effect of Hole Cleaning on Drilling Rate and Performance", AADE-04-DF-HO-42, American Association of Drilling Engineers, Apr. 2004, pp. 1-7 (7 pages).

Williams, Jr., C.E. and G.H. Bruce, "Carrying Capacity of Drilling Muds", T.P. 3026, Petroleum Transactions, AIME, vol. 192, 1951, pp. 111-120 (10 pages).

Pigott, R.J.S., "Mud Flow in Drilling", Drilling and Production Practice, American Petroleum Institute, 1941, pp. 91-103 (13 pages).

Mohammadsalehi. M. and Malekzadah, N.; "Application of New Hole Cleaning Optimization Method within All Ranges of Hole Inclinations", IPTC 14154; International Petroleum Technology Conference; Feb. 2012; pp. 1-8 (8 pages).

Samsuri, A. and Hamzah, A.; "Water based mud lifting capacity improvement by multiwall carbon nanotubes additive", Journal of Petroleum and Gas Engineering; vol. 2; No. 5; Apr. 12, 2011; pp. 99-107 (9 pages).

H. N. Hall et al.; "Ability Of Drilling Mud To Lift Bit Cuttings", Petroleum Transactions, AIME; vol. 189; 1950; pp. 35-46 (12 pages).

Pandya et al.; "Effects of Particle Density on Hole Cleanout Operation in Horizontal and Inclined Wellbores", SPE-194240-MS; Society of Petroleum Engineers; Mar. 2019; pp. 1-22 (22 pages).

Walker, R.E. and Mayes, T. M.; "Design of Muds for Carrying Capacity", SPE-4975-PA; Journal of Petroleum Technology; vol. 27; No. 7; Jul. 1975; pp. 893-900 (8 pages).

R. H. McLean; "Velocities, Kinetic Energy and Shear in Crossflow Under Three-Cone Jet Bits", SPE 1306; Society of Petroleum Engineers; Dec. 1965; pp. 1443-1448 (6 pages).

Di, Jianwei and Jerry L. Jensen, "A New Approach for Permeability Prediction With NMR Measurements in Tight Formations", Aug. 2016 SPE Reservoir Evaluation & Engineering, Society of Petroleum Engineers, 2016, pp. 481-493 (13 pages).

Dziuba, Taras T., "Improved Permeability Prediction in Carbonates", SPWLA 37th Annual Logging System Symposium, Jun. 1996, pp. 1-12 (12 pages).

Lonnes, Steve et al., "NMR Petrophysical Predictions on Cores", SPWLA 44th Annual Logging Symposium, Jun. 2003, pp. 1-14 (14 pages).

Keating, Kristina et al., "Improving pore-size distribution and permeability prediction from NMR using DT2 maps", SEG International Exposition and 89th Annual Meeting, SEG, 2019, pp. 4809-4813 (5 pages).

Wampler, J.J. et al., "Estimating permeability in UAE carbonates using NMR", SEG Denver 2010 Annual Meeting, SEG, 2010, pp. 2649-2653 (5 pages).

Zayed, Samy et al., "Permeability Prediction Using NMR Measurements for Some Gas Reservoirs—Nile Delta, Egypt", 14th Offshore Mediterranean Conference and Exhibition, Mar. 2019, pp. 1-11 (11 pages).

Raheem, Oriyomi Nurudeen et al., "Using NMR T2 to Predict the Drainage Capillary Curves Pc-Sw in Carbonates Reservoirs", SPE-185989-MS, Society of Petroleum Engineers, May 2017, pp. 1-34 (34 pages).

Arns, C.H. et al., "Prediction of permeability from NMR response: surface relaxivity heterogeneity", SPWLA 47th Annual Logging Symposium, Society of Petrophysicists and Well Log Analysts, Jun. 2006, pp. 1-13 (13 pages).

Nicot, Benjamin et al., "Improvement of Viscosity Prediction Using NMR Relaxation", SPWLA 48th Annual Logging Symposium, Society of Petrophysicists and Well Log Analysts, Jun. 2007, pp. 1-7 (7 pages).

Musu, Junita Triviantyand Bambang Widarsono, "Determination of NMR T2 cut off for ductile, low permeability shaly sandstone", ASEG Extended Abstracts, Taylor & Francis, 2007:1, pp. 1-10 (11 pages).

Besghini, Denise et al., "Time Domain NMR in Polymer Science: From the Laboratory to the Industry", Applied Sciences, MDPI, vol. 9, No. 1801, Apr. 2019, pp. 1-33 (33 pages).

Salimifard, Babak et al., "Optimizing NMR Data Acquisition and Data Processing Parameters for Tight-Gas Montney Formation of Western Canada", SCA2017-020, International Syposium of the Society of Core Analysts, Aug.-Sep. 2017, pp. 1-13 (13 pages).

International Search Report and Written Opinion issued in corresponding International Patent Application No. PCT/US2022/015320, mailed on May 11, 2022 (12 pages).

(56) References Cited

OTHER PUBLICATIONS

International Search Report and Written Opinion issued in corresponding International Patent Application No. PCT/US2022/016160, mailed on May 11, 2022 (18 pages).
Alawami, M. et al., "SPE-196448-MS: A Real-Time Indicator for the Evaluation of Hole Cleaning—Ã Efficiency," SPE International, Society of Petroleum Engineers, pp. 1-9, Oct. 25, 2020 (9 pages).
Al-Rubaii, M.M. et al., "IPTC-19809-MS: Automated Evaluation of Hole Cleaning Efficiency While Drilling Improves Rate of Penetration," IPTC, pp. 1-17, Jan. 13, 2020 (17 pages).
Office Action issued in corresponding Saudi Arabian Application No. 122440690; dated May 6, 2024 (6 pages).
Office Action issued in corresponding Saudi Arabian Application No. 523450263; dated May 19, 2024 (14 pages).
"Permeability estimation with NM R logging," PetroWiki, Glenda Smith; Mar. 27, 2013, https://petrowiki.spe.org/Permeability estimation_with_N M R_logging; https://petrowiki.spe.org/File:Vol5_Page_0323_Image_001. png (Year: 2013) (5 pages).
Office Action issued by Saudi Arabian patent office for corresponding Saudi Arabian patent application No. 523450263, mailed Oct. 7, 2024 (11 pages).

* cited by examiner

431 Cross-correlation Value A = 91%

432 T2 Cutoff Value C = 3162 ms

| Total NMR Porosity 441 | Bulk Fluid Volume (BFV) Values 442 | Ratio Values of FFI to BFV 443 |
|---|---|---|
| 0.1231 | 0.0353 | 2.48 |
| 0.1615 | 0.0316 | 4.11 |
| 0.1842 | 0.0338 | 4.45 |
| 0.2265 | 0.0282 | 7.05 |
| 0.2237 | 0.0223 | 9.02 |
| 0.2176 | 0.0227 | 8.59 |
| 0.2324 | 0.0436 | 4.33 |
| 0.2193 | 0.0351 | 5.25 |
| 0.2090 | 0.0271 | 6.72 |
| 0.1989 | 0.0269 | 6.38 |

700 User Interface

701 Training Dataset Files

File Set:

| File Name | Num Plugs | Top | Bottom | Nselect |
|---|---|---|---|---|
| | 185 | 6.3469e+03 | 1.2108e+04 | 185 |
| | 632 | 5.8896e+03 | 7.2666e+03 | 632 |
| | 77 | 5.9337e+03 | 7.0909e+03 | 77 |
| | 236 | 6.0253e+03 | 7.2599e+03 | 236 |
| | 170 | 6.6395e+03 | 6.8199e+03 | 170 |

702 Training Filters

| Property | Minimum | Maximum |
|---|---|---|
| Grain Density | 0 | 3.5000 |
| Core Porosity | 0 | 0.5000 |
| Core Permeability | 0 | 10000 |
| NMR Porosity | 0 | 0.5000 |
| NMR T2 Geometric Mean | 0 | 5000 |

703 Formations

| Formation |
|---|
| A |
| D |
| H |
| K |
| K |

*FIG. 7A*

700 User Interface

704 T2 Cutoff Values

1778.27941
1995.26231
2238.72114
2511.88643
2818.38293
3162.27766
3548.13389

703 Formations

A
D
H
K
K

705 Training Well Selections

METHOD AND SYSTEM FOR DETERMINING PERMEABILITY AND LOST CIRCULATION

BACKGROUND

A subsurface formation may be determined using various measurements obtained through logging tools. For example, these measurements may be used to calculate porosity, permeability, and other properties of a reservoir formation. However, in many situations, logging tool measurements may be unavailable for determining unique conditions within a wellbore and a subterranean formation, e.g., with respect to propagating fractures.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a method that includes obtaining, by a computer processor, first nuclear magnetic resonance (NMR) data and acquired permeability data regarding a geological region of interest. The method further includes determining, by the computer processor, and using a neural network and second NMR data, predicted permeability data regarding a predetermined formation within the geological region of interest. The neural network is trained using the first NMR data and the acquired permeability data. The method further includes determining, by the computer processor, a predetermined fracture size within the predetermined formation based on the predicted permeability data. The method further includes determining, by the computer processor, a predetermined type of lost circulation material (LCM) based on the predetermined fracture size. The method further includes transmitting, by the computer processor, a command to a well system that triggers a well operation using the predetermined type of LCM.

In general, in one aspect, embodiments relate to a method that includes obtaining, using a computer processor, first nuclear magnetic resonance (NMR) data for a target well and second NMR data for various training wells. The method further includes obtaining, using the computer processor, acquired permeability data for the training wells. The acquired permeability data is acquired using core samples from the training wells. The method further includes determining, using the computer processor, a neural network, and the second NMR data, predicted permeability data for the target well. The method further includes updating, using the computer processor, the neural network based on a difference between the predicted permeability data and the acquired permeability data. The neural network is updated to produce a trained neural network by adjusting a T2 cutoff value regarding the first NMR data and the second NMR data for different formations.

In general, in one aspect, embodiments relate to a system that includes a logging system coupled to a nuclear magnetic resonance (NMR) logging tool and a well system coupled to the logging system and a wellbore. The system further includes a reservoir simulator that includes a computer processor. The reservoir simulator is coupled to the logging system and the well system. The reservoir simulator obtains, by the NMR logging tool, first NMR data regarding a geological region of interest. The reservoir simulator determines, using a neural network and the first NMR data, predicted permeability data regarding a predetermined formation within the geological region of interest. The neural network is trained using second NMR data and acquired permeability data regarding the geological region of interest. The reservoir simulator determines a predetermined fracture size within the predetermined formation based on the predicted permeability data. The reservoir simulator determines a predetermined type of lost circulation material (LCM) based on the predetermined fracture size. The reservoir simulator transmits a command to a well system that triggers a well operation using the predetermined type of LCM.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIGS. 7A and 7B show examples in accordance with one or more embodiments.

DETAILED DESCRIPTION

Figure 1:
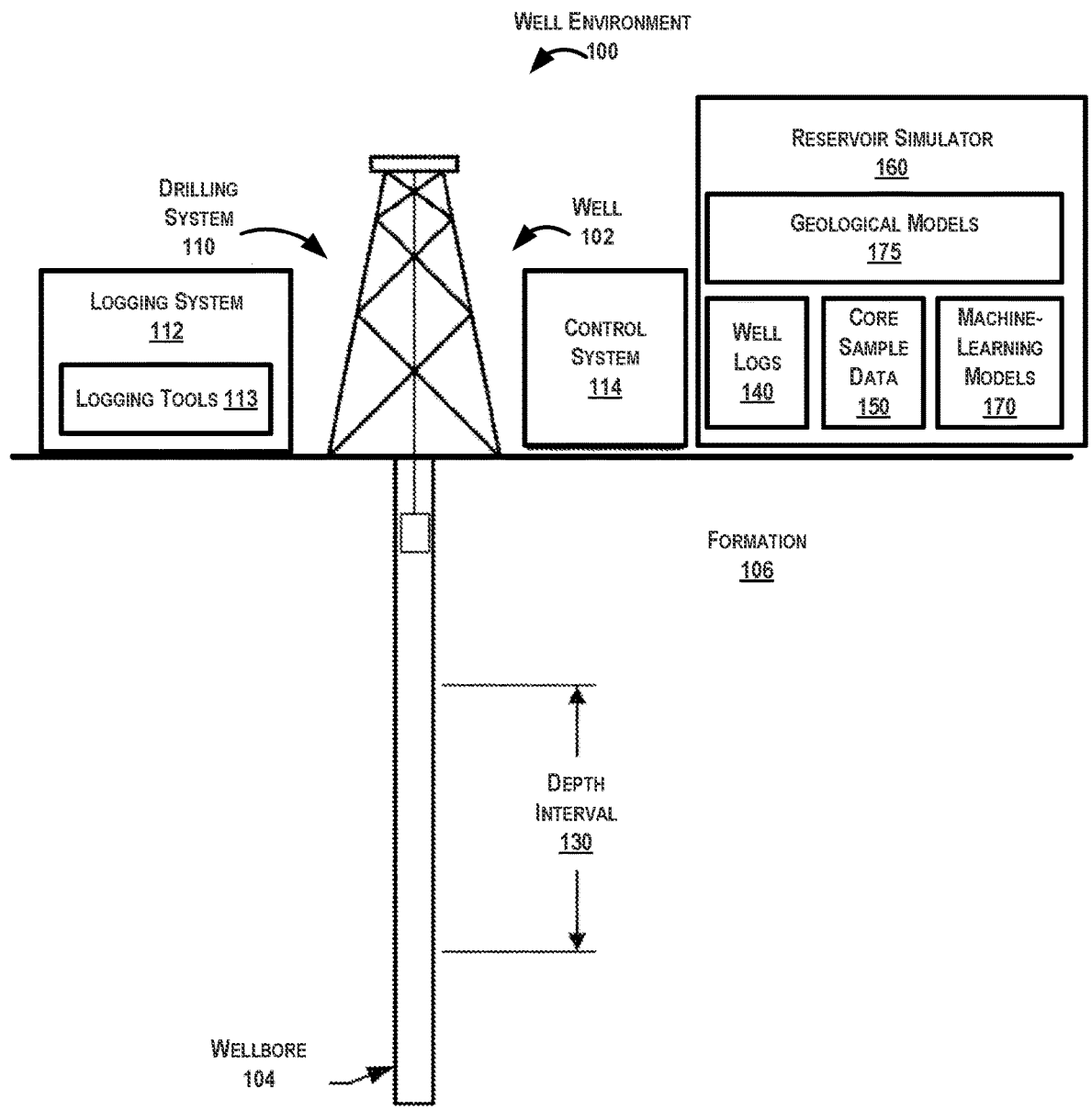
FIGS. 1, 2A, and 2B show systems in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for predicting lost circulation events during drilling operations and/or cementing operations in a well system. In particular, lost circulation may be a significant dilemma in the drilling industry, especially in regard to depleted and mature oil fields. As such, some embodiments disclosed herein use machine-learning techniques to predict permeability data in a geological region prone to a loss of circulation. More specifically, an output of a machine-learning model, such as a neural network, may be used to determine a fracture size within a targeted formation. Based on the predicted fracture size, a selection of a lost circulation material (LCM) may be optimized in order to cure fluid losses (e.g., drilling fluid or cement slurry) as well as minimize damage to formations. Likewise, some embodiments may enable an improved understanding of the physics of lost circulation under in-situ conditions in order to determine successful mitigation operations. In other words, areas of high permeability within a reservoir may indicate a vulnerability to a lost circulation. By predicting which formations have high permeabilities, a particular type of lost circulation material may be used that corresponds to the available well conditions. Thus, some embodiments may be used with respect to cementing operations, drilling processes, and/or any other NMR tasks performed after the cementing process and well completion. For example, some embodiments are applicable to NMR tasks performed after cementing failures.

Furthermore, some embodiments use nuclear magnetic resonance (NMR) data to predict permeability for a target well without previously acquired permeability data. For example, where acquired permeability data may be based on analyzing core samples in a laboratory, NMR data may be acquired in real-time during drilling operations. However, in order to predict permeability data using NMR data, a machine-learning model may need to be trained using available data from other wells. To train a neural network, for example, similar training wells may be selected that match the available NMR data for a target well. Likewise, the NMR data for the training wells may be analyzed using multiple T2 cutoff values as well as ratio values of free fluid volume index (FFI) over bound fluid volumes (BFV). Where a single T2 cutoff value may fail to provide an accurate picture of fluid dynamics in a geological region, using NMR data based on multiple T2 cutoff values (e.g., seven different T2 cutoff values) may enable the machine-learning model to approximate the relationship between NMR data for the target well and permeability available for the training wells.

FIG. 1 shows a schematic diagram in accordance with one or more embodiments. As shown, FIG. 1 illustrates a well environment (100) that may include a well (102) having a wellbore (104) extending into a formation (106). The wellbore (104) may include a bored hole that extends from the surface into a target zone of the formation (106), such as a reservoir. The formation (106) may include various formation characteristics of interest, such as formation porosity, formation permeability, resistivity, density, water saturation, and the like. Porosity may indicate how much space exists in a particular rock within an area of interest in the formation (106), where oil, gas, and/or water may be trapped. Permeability may indicate the ability of liquids and gases to flow through the rock within the area of interest. Resistivity may indicate how strongly rock and/or fluid within the formation (106) opposes the flow of electrical current. For example, resistivity may be indicative of the porosity of the formation (106) and the presence of hydrocarbons. More specifically, resistivity may be relatively low for a formation that has high porosity and a large amount of water, and resistivity may be relatively high for a formation that has low porosity or includes a large amount of hydrocarbons. Water saturation may indicate the fraction of water in a given pore space.

Keeping with FIG. 1, the well environment (100) may include reservoir simulator (160) and various well systems, such as a drilling system (110), a logging system (112), a control system (114), and a well completion system (not shown). The drilling system (110) may include a drill string, drill bit, a mud circulation system and/or the like for use in boring the wellbore (104) into the formation (106). The control system (114) may include hardware and/or software for managing drilling operations and/or maintenance operations. For example, the control system (114) may include one or more programmable logic controllers (PLCs) that include hardware and/or software with functionality to control one or more processes performed by the drilling system (110). Specifically, a programmable logic controller may control valve states, fluid levels, pipe pressures, warning alarms, and/or pressure releases throughout a drilling rig. In particular, a programmable logic controller may be a ruggedized computer system with functionality to withstand vibrations, extreme temperatures, wet conditions, and/or dusty conditions, for example, around a drilling rig. Without loss of generality, the term "control system" may refer to a drilling operation control system that is used to operate and control the equipment, a drilling data acquisition and monitoring system that is used to acquire drilling process and equipment data and to monitor the operation of the drilling process, or a drilling interpretation software system that is used to analyze and understand drilling events and progress. A logging system may be similar to a control system with a specific focus on managing one or more logging tools.

Turning to the reservoir simulator (160), a reservoir simulator (160) may include hardware and/or software with functionality for storing and analyzing well logs (140), core sample data (150), seismic data, and/or other types of data to generate and/or update one or more geological models (175). Geological models may include geochemical or geomechanical models that describe structural relationships within a particular geological region. While the reservoir simulator (160) is shown at a well site, in some embodiments, the reservoir simulator (160) may be remote from a well site. In some embodiments, the reservoir simulator (160) is implemented as part of a software platform for the control system (114). The software platform may obtain data acquired by the drilling system (110) and logging system (112) as inputs, which may include multiple data types from multiple sources. The software platform may aggregate the data from these systems (110, 112) in real time for rapid analysis. In some embodiments, the control system (114), the logging system (112), the reservoir simulator (160), and/or a user device coupled to one of these systems may include a computer system that is similar to the computer system (802) described below with regard to FIG. 8 and the accompanying description.

The logging system (112) may include one or more logging tools (113) for use in generating well logs of the formation (106). For example, a logging tool may be lowered into the wellbore (104) to acquire measurements as the tool traverses a depth interval (130) (e.g., a targeted reservoir section) of the wellbore (104). The plot of the logging measurements versus depth may be referred to as a "log" or "well log". Well logs (140) may provide depth measurements of the well (104) that describe such reservoir characteristics as formation porosity, formation permeability, resistivity, water saturation, and the like. The resulting logging measurements may be stored and/or processed, for example, by the control system (114), to generate corresponding well logs for the well (102). A well log (140) may include, for example, a plot of a logging response time versus true vertical depth (TVD) across the depth interval (130) of the wellbore (104).

Turning to examples of logging techniques, multiple types of logging techniques are available for determining various reservoir characteristics. For example, a nuclear magnetic resonance (NMR) logging tool may measure the induced magnetic moment of hydrogen nuclei (i.e., protons) contained within the fluid-filled pore space of porous media (e.g., reservoir rocks). Thus, NMR logs may measure the magnetic response of fluids present in the pore spaces of the reservoir rocks. In so doing, NMR logs may measure both porosity and permeability, as well as the types of fluids present in the pore spaces. Thus, NMR logging may be a subcategory of electromagnetic logging that responds to the presence of hydrogen protons rather than a rock matrix. Because hydrogen protons may occur primarily in pore fluids, NMR logging may directly or indirectly measure the volume, composition, viscosity, and distribution of pore fluids.

NMR logging techniques may determine multiple signals for analyzing a geological region. First, NMR logging may determine spin-lattice relaxation values or a T1 signal amplitude that is measured from the buildup of magnetization along a static applied magnetic field. For example, a T1 value may be the time needed to reach 63% of the maximum magnetization possible at its final value. Three times of a T1 value may be equal to 95% of polarization. Large values of T1 may indicate weak coupling between fluid and a slow approach to the magnetic equilibrium. However, small T1 values may show strong coupling to quickly reach the equilibrium state. Thus, T1 signal values may be mainly related to pore size and viscosity. Likewise, a T1 signal may be measured using inversion recovery or saturation recovery, where the T1 signal may be characterized as the loss of resonance intensity following a pulse excitation. Inversion recovery may include a 180° spin inversion followed by a variable recovery time and then a 90° read pulse. On the other hand, saturation recovery may use a 90° pulse, followed by a 90° read pulse.

Furthermore, NMR logging may also determine transverse relaxation values or a T2 signal amplitude that describes the decay of an excited magnetization perpendicular to an applied magnetic field. More specifically, a T2 signal may be determined using a spin-echo technique, where hydrogen protons are first tipped into the transverse plane by a 90° RF pulse and then inverted by a subsequent 180° pulse at a fixed-time interval to rephase the dephasing protons. The T2 signal may refer to the decaying time for hydrogen protons to complete dephasing. Likewise, NMR logging measurements may be illustrated as a T2 signal amplitude versus time and determine a distribution of porosity components (i.e., a T2 distribution) as a function of their T2 times. Thus, a T2 signal amplitude may be proportional to hydrogen content within a geological region and thus may determine porosity independent of the rock matrix. Both relaxation times may provide information for determining pore-size information and pore-fluid properties, especially viscosity.

Keeping with T2 signals, NMR logging measurements may use a T2 cutoff value (which may be referred to as a "$T_{2c}$ value" or a "$T_{2cutoff}$ value") in order to divide effective porosity into movable and irreducible fluid saturations. A T2 cutoff value may be the maximum T2 signal amplitude for a portion of porosity that is occupied by immovable fluids. Accordingly, the T2 cutoff value may distinguish free fluid volume (FFV) from non-movable fluid or bound fluid volume (BFV) in a geological region. In a T2 distribution, a BVI value may include T2 amplitudes in the spectrum having T2 values less than the T2 cutoff value. In other words, a T2 cutoff value may be the sum of porosities whose T2 amplitude is less than the T2 cutoff value and consequently an FFI value may be the sum of T2 amplitudes that are greater than the T2 cutoff value. Likewise, T2 signal values above the T2 cutoff value may indicate large pores that are potentially capable of production. On the other hand, T2 signal values below the T2 cutoff value may indicate small pores containing fluid trapped by capillary pressure with little production capacity. Therefore, the T2cutoff value may be used to analyze the ratio of irreducible fluid and movable fluid in porous rock. Accordingly, a T2 value distribution may also provide a permeability prediction of a geological region.

Various reservoir parameters may be determined by analyzing T2 signal data. For example, NMR porosity ("MPHI") may be determined by an integral of a saturated T2 distribution curve, which may be the area under a T2 signal curve. Likewise, a core sample may be centrifuged in order to repeat an NMR measurement to determine a value of the bulk volume irreducible of water (BVI) or amount of irreducible fluid in the core sample. A free fluid index (FFI) value may be the difference between total porosity and the BVI value. BVI values may correspond to the immovable or bound water in a formation, such as a capillary bound water. Thus, BVI may be a function of the pore-throat size distribution, where high threshold pressure due to smaller pore throats retains the fluids in the pores. BVI values may be determined using a cutoff-BVI (CBVI) model or a spectral BVI (SBVI) model, for example.

In some embodiments, the T2 cutoff value may be a constant value applied throughout a particular formation. For example, a T2 cutoff value of 33 ms and another T2 cutoff value of 22.6 ms have been used for analyzing sandstone formations. In another example, a T2 cutoff value of 33 ms has been used with a clastic reservoir to estimate BFV values and FFV values. In another example, four T2 cutoff values of 10 ms, 15 ms, 20 ms, and 33 ms may be used to determine four sets of bound fluid volume (BFV) and free fluid volume (FFV) values. However, T2 cutoff values may vary in different formations and in different fields due to reservoir temperatures, surface relaxivity of a rock surface, and other field factors. In particular, surface relaxivity may depend on mineralogy of a particular formation, such as the presence of paramagnetic/ferromagnetic minerals and adsorbed water in the formation.

Other types of logging techniques may also be used to analyze a geological region. For determining permeability, another type of logging may be used that is called spontaneous potential (SP) logging. SP logging may determine the permeabilities of rocks in the formation (106) by measuring the amount of electrical current generated between drilling fluid produced by the drilling system (110) and formation water that is held in pore spaces of the reservoir rock. Porous sandstones with high permeabilities may generate more electricity than impermeable shales. Thus, SP logs may be used to identify sandstones from shales. To determine porosity in the formation (106), the logging system (112) may measure the speed that acoustic waves travel through rocks in the formation (106). This type of logging may generate borehole compensated (BHC) logs, which are also called sonic logs. In general, sound waves may travel faster through high-density shales than through lower-density sandstones. Likewise, density logging may also determine porosity measurements by directly measuring the density of the rocks in the formation (106). Furthermore, neutron logging may determine porosity measurements by assuming that the reservoir pore spaces within the formation (106) are filled with either water or oil and then measuring the amount of hydrogen atoms (i.e., neutrons) in the pores. Other types of logging are also contemplated, such as resistivity logging and dielectric logging.

Reservoir characteristics may be determined using a variety of different techniques at a well site. For example, certain reservoir characteristics can be determined via coring (e.g., physical extraction of rock specimens) to produce core specimens and/or logging operations (e.g., wireline logging, logging-while-drilling (LWD) and measurement-while-drilling (MWD)). Coring operations may include physically extracting a rock specimen from a region of interest within the wellbore (104) for detailed laboratory analysis. For example, when drilling an oil or gas well, a coring bit may cut core plugs (or "cores" or "core specimens") from the formation (106) and bring the core plugs to the surface, and these core specimens may be analyzed at the surface (e.g., in a lab) to determine various characteristics of the formation (106) at the location where the specimen was obtained.

Turning to various coring technique examples, conventional coring may include collecting a cylindrical specimen of rock from the wellbore (104) using a core bit, a core barrel, and a core catcher. The core bit may have a hole in its center that allows the core bit to drill around a central cylinder of rock. Subsequently, the resulting core specimen may be acquired by the core bit and disposed inside the core barrel. More specifically, the core barrel may include a special storage chamber within a coring tool for holding the core specimen. Furthermore, the core catcher may provide a grip to the bottom of a core and, as tension is applied to the drill string, the rock under the core breaks away from the undrilled formation below coring tool. Thus, the core catcher may retain the core specimen to avoid the core specimen falling through the bottom of the drill string.

Figure 2A:
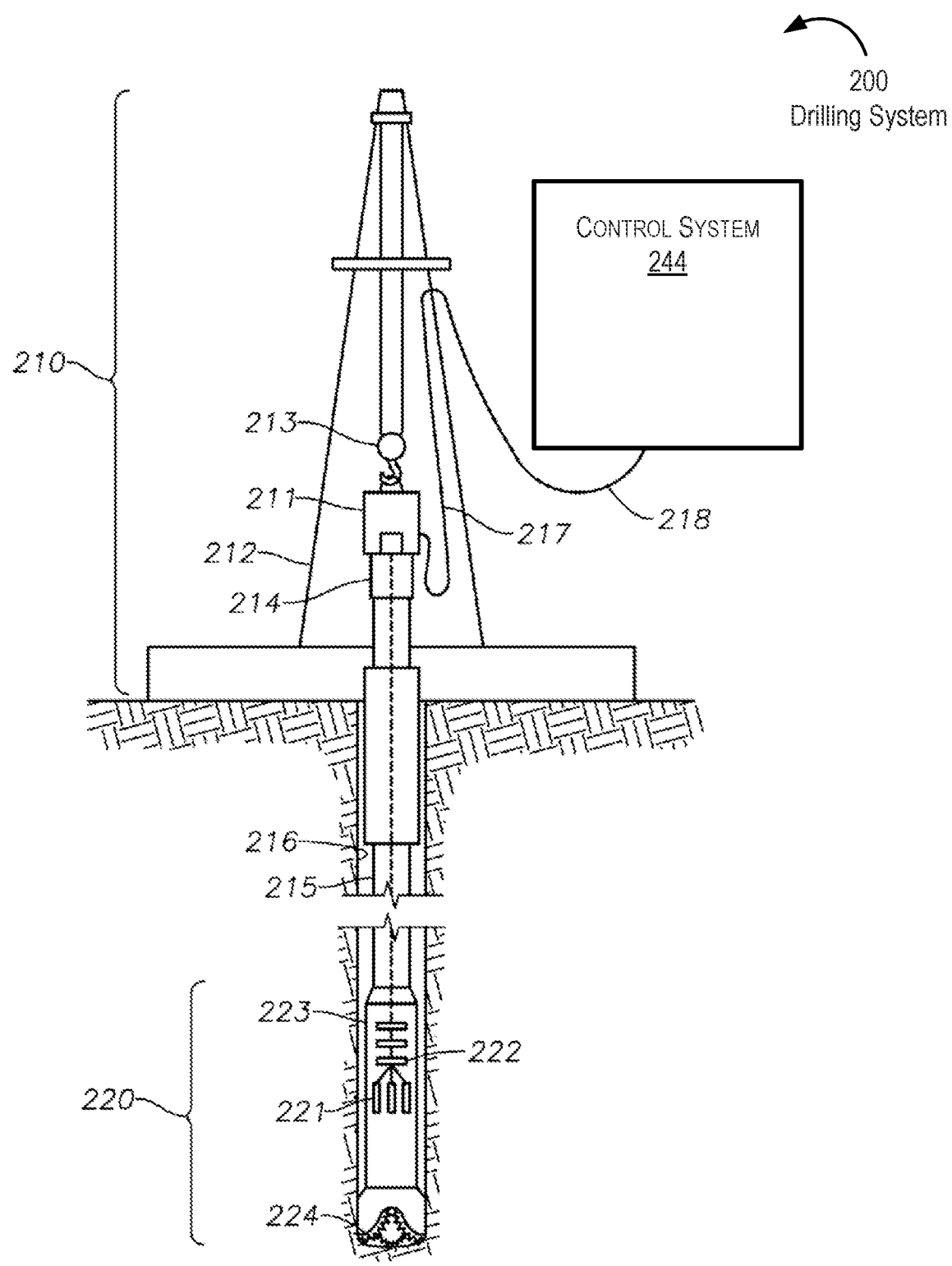
Figure 2B:
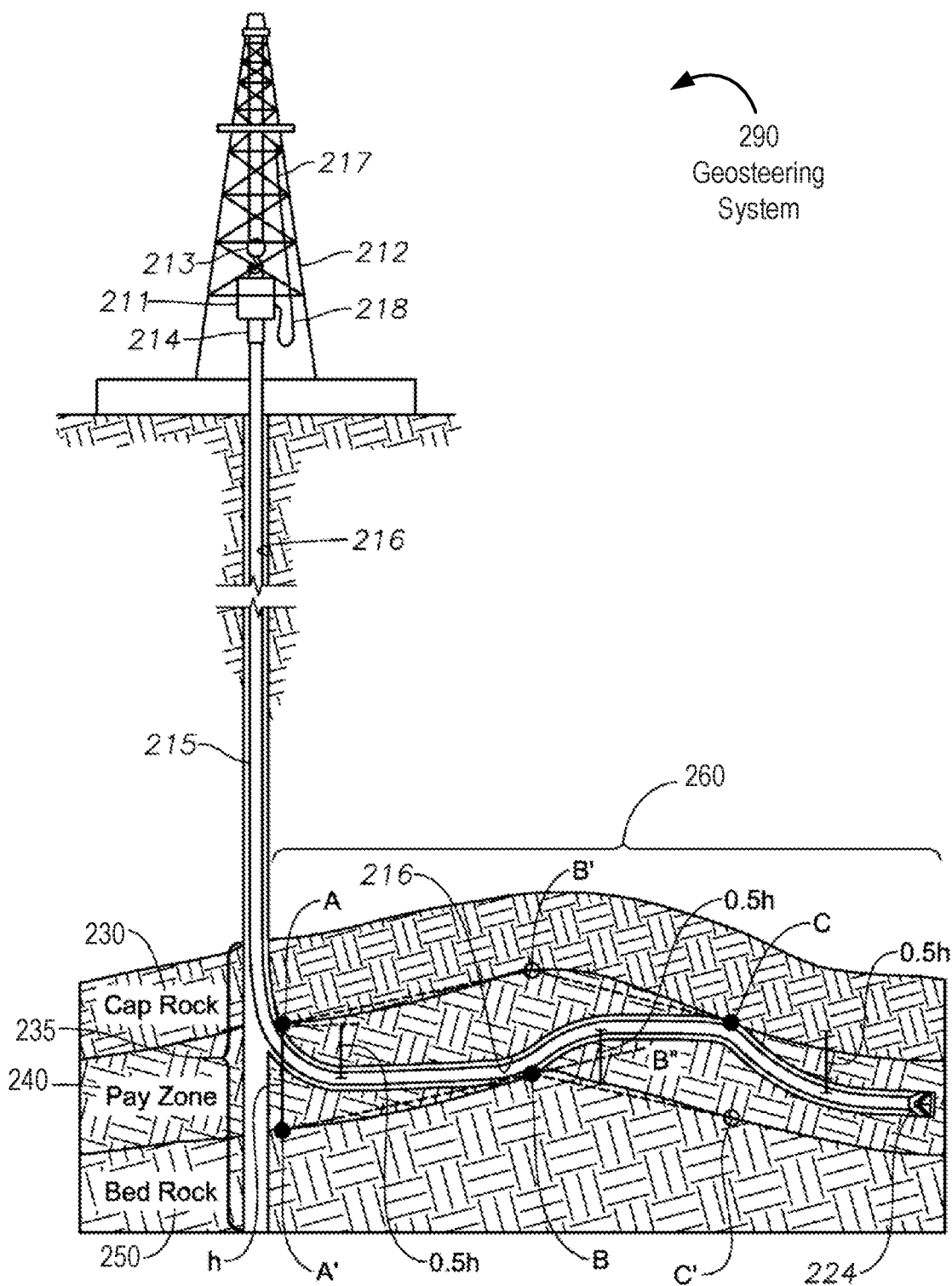

FIGS. 2A and 2B illustrate systems in accordance with one or more embodiments. As shown in FIG. 2A, a drilling system (200) may include a top drive drill rig (210) arranged around the setup of a drill bit logging tool (220). A top drive drill rig (210) may include a top drive (211) that may be suspended in a derrick (212) by a travelling block (213). In the center of the top drive (211), a drive shaft (214) may be coupled to a top pipe of a drill string (215), for example, by threads. The top drive (211) may rotate the drive shaft (214) so that the drill string (215) and a drill bit logging tool (220) cut the rock at the bottom of a wellbore (216). A power cable (217) supplying electric power to the top drive (211) may be protected inside one or more service loops (218) coupled to a control system (244). As such, drilling mud may be pumped into the wellbore (216) through a mud line, the drive shaft (214), or the drill string (215). The control system (244) may be similar to control system (114) described in FIG. 1 and the accompanying description.

As further shown in FIG. 2A, sensors (221) may be included in a sensor assembly (223), which is positioned adjacent to a drill bit (224) and coupled to the drill string (215). Sensors (221) may also be coupled to a processor assembly (223) that includes a processor, memory, and an analog-to-digital converter (222) for processing sensor measurements. For example, the sensors (221) may include acoustic sensors, such as accelerometers, measurement microphones, contact microphones, and hydrophones. Likewise, the sensors (221) may include other types of sensors, such as transmitters and receivers to measure resistivity, gamma ray detectors, etc. The sensors (221) may include hardware and/or software for generating different types of well logs (such as acoustic logs or density logs) that may provide well log data about a wellbore, including porosity of wellbore sections, gas saturation, bed boundaries in a geologic formation, fractures in the wellbore or completion cement, and many other pieces of information about a formation. If such well log data is acquired during drilling operations (e.g., logging-while-drilling or measurement-while-drilling), then the information may be used to make adjustments to drilling parameters in real-time. Such adjustments may include rate of penetration (ROP), a bottom-hole circulating pressure, one or more drilling directions, altering mud weight, the amount of weight-on-bit, and many others drilling parameters.

In some embodiments, acoustic sensors may be installed in a drilling fluid circulation system of a drilling system (200) to record acoustic drilling signals in real-time. Drilling acoustic signals may transmit through the drilling fluid to be recorded by the acoustic sensors located in the drilling fluid circulation system. The recorded drilling acoustic signals may be processed and analyzed to determine well data, such as lithological and petrophysical properties of the rock formation. This well data may be used in various applications, such as steering a drill bit using geosteering, casing shoe positioning, etc.

The control system (244) may be coupled to the sensor assembly (223) in order to perform various program functions for up-down steering and left-right steering of the drill bit (224) through the wellbore (216). More specifically, the control system (244) may include hardware and/or software with functionality for geosteering a drill bit through a formation in a lateral well using sensor signals, such as drilling acoustic signals or resistivity measurements. For example, the formation may be a reservoir region, such as a pay zone, bed rock, or cap rock.

Returning to FIG. 1, when completing a well, one or more well completion operations may be performed prior to delivering the well to the party responsible for production or injection. Well completion operations may include casing operations, cementing operations, perforating the well, gravel packing, directional drilling, hydraulic stimulation of a reservoir region, and/or installing a production tree or wellhead assembly at the wellbore (104). Likewise, well operations may include open-hole completions or cased-hole completions. For example, an open-hole completion may refer to a well that is drilled to the top of the hydrocarbon reservoir. Thus, the well is cased at the top of the reservoir, and left open at the bottom of a wellbore. In contrast, cased-hole completions may include running casing into a reservoir region. Cased-hole completions are discussed further below with respect to perforation operations.

With regard to cementing well operations, a space between the casing and the untreated sides of the wellbore (104) may be cemented to hold a casing in place. This well operation may include pumping cement slurry into the wellbore (104) to displace existing drilling fluid and fill in this space between the casing and the untreated sides of the wellbore (104). Cement slurry may include a mixture of various additives and cement. After the cement slurry is left to harden, cement may seal the wellbore (104) from non-hydrocarbons that attempt to enter the well stream. In some embodiments, the cement slurry is forced through a lower end of the casing and into an annulus between the casing and a wall of the wellbore (104). More specifically, a cementing plug may be used for pushing the cement slurry from the casing. For example, the cementing plug may be a rubber plug used to separate cement slurry from other fluids, reducing contamination and maintaining predictable slurry performance. A displacement fluid, such as water, or an appropriately weighted drilling fluid, may be pumped into the casing above the cementing plug. This displacement fluid may be pressurized fluid that serves to urge the cementing plug downward through the casing to extrude the cement from the casing outlet and back up into the annulus.

During some well operations, a lost circulation event may occur that results in a partial or complete loss of drilling fluid and/or cement slurry into a formation. For example, a lost circulation event may be brought on by natural causes or induced causes within the formation. Natural causes may include naturally-occurring fractures adjacent to a wellbore as well as unconsolidated zones. Induced causes may include a situation when a hydrostatic fluid pressure exceeds a fracture gradient of the formation resulting in a fracture receiving fluid rather than resisting the fluid. When drilling into highly fractured formations, for example, severe fluid losses may be encountered that pose serious threats to drilling operations. Fluid losses may lead to various risks such as high costs of replacing drilling fluid during the drilling operation, formation damage left behind by lost circulation treatments, and even a possible loss of hydrostatic pressure that can cause an influx of gas or fluid, e.g., resulting in a well blowout.

With respect to drilling operations, various types of lost circulation material (LCMs) may be used in a lost circulation treatment to prevent or reduce drilling fluids from being lost inside downhole formations. LCM examples may include fibrous materials (e.g., cedar bark, shredded cane stalks, mineral fiber, and hair), flaky materials (e.g., mica flakes, pieces of plastic, and cellophane sheeting) or granular materials (e.g., ground and sized materials such as limestone, marble, wood, nut hulls, Formica, corncobs, and cotton hulls). A fibrous LCM may include long, slender and flexible substances that are insoluble and inert, where the fibrous material may assist in retarding drilling fluid loss into fractures or highly permeable zones. A flaky LCM may be thin and flat in shape with a large surface area in order to seal off fluid loss zones in a wellbore and help stop lost circulation. A granular LCM may be chunky in shape with a range of particle sizes. LCMs may also include one or more bridging agents that may include solids added to a drilling fluid to bridge across a pore throat or fractures of an exposed rock thereby producing a filter cake to prevent drilling fluid loss or excessive filtration. Example bridging agents may include removable-common products include calcium carbonate (acid-soluble), suspended salt (water-soluble) or oil-soluble resins. In some embodiments, granular materials, flaky materials, and/or fibrous materials are combined into an LCM pill and pumped into a wellbore next to a zone experiencing fluid loss to seal the formation.

With respect to cementing operations, some techniques to address lost circulation may include using a bridging material or plugging material within a wellbore, such as the use of a rapid-set or thixotropic cement. Likewise, cement slurry may have its slurry density reduced, e.g., by using lightweight cement, to address a lost circulation event.

Turning to geosteering, geosteering may be used to position the drill bit (224) or drill string (215) relative to a boundary between different subsurface layers (e.g., overlying, underlying, and lateral layers of a pay zone) during drilling operations. In particular, measuring rock properties during drilling may provide the drilling system (200) with the ability to steer the drill bit (224) in the direction of desired hydrocarbon concentrations. As such, a geo steering system may use various sensors located inside or adjacent to the drill string (215) to determine different rock formations within a wellbore's path. In some geosteering systems, drilling tools may use resistivity or acoustic measurements to guide the drill bit (224) during horizontal or lateral drilling.

Turning to FIG. 2B, FIG. 2B illustrates some embodiments for steering a drill bit through a lateral pay zone using a geosteering system (290). As shown in FIG. 2B, the geosteering system (290) may include the drilling system (200) from FIG. 2A. In particular, the geosteering system (290) may include functionality for monitoring various sensor signatures (e.g., an acoustic signature from acoustic sensors) that gradually or suddenly change as a well path traverses a cap rock (230), a pay zone (240), and a bed rock (250). Because of the sudden change in lithology between the cap rock (230) and the pay zone (240), for example, a sensor signature of the pay zone (240) may be different from the sensor signature of the cap rock (230). When the drill bit (224) drills out of the pay zone (240) into the cap rock (230), a detected amplitude spectrum of a particular sensor type may change suddenly between the two distinct sensor signatures. In contrast, when drilling from the pay zone (240) downward into the bed rock (250), the detected amplitude spectrum may gradually change.

During the lateral drilling of the wellbore (216), preliminary upper and lower boundaries of a formation layer's thickness may be derived from a geophysical survey and/or an offset well obtained before drilling the wellbore (216). If a vertical section (235) of the well is drilled, the actual upper and lower boundaries of a formation layer (i.e., actual pay zone boundaries (A, A')) and the pay zone thickness (i.e., A to A') at the vertical section (235) may be determined. Based on this well data, an operator may steer the drill bit (224) through a lateral section (260) of the wellbore (216) in real time. In particular, a logging tool may monitor a detected sensor signature proximate the drill bit (224), where the detected sensor signature may continuously be compared against prior sensor signatures, e.g., of the cap rock (230), pay zone (240), and bed rock (250), respectively. As such, if the detected sensor signature of drilled rock is the same or similar to the sensor signature of the pay zone (240), the drill bit (224) may still be drilling in the pay zone (240). In this scenario, the drill bit (224) may be operated to continue drilling along its current path and at a predetermined distance (0.5 h) from a boundary of a formation layer. If the detected sensor signature is same as or similar to the prior sensor signatures of the cap rock (230) or the bed rock (250), respectively, then the control system (244) may determine that the drill bit (224) is drilling out of the pay zone (240) and into the upper or lower boundary of the pay zone (240). At this point, the vertical position of the drill bit (224) at this lateral position within the wellbore (216) may be determined and the upper and lower boundaries of the pay zone (240) may be updated, (for example, positions B and C in FIG. 2B). In some embodiments, the vertical position at the opposite boundary may be estimated based on the predetermined thickness of the pay zone (240), such as positions B' and C'.

Returning to FIG. 1, geosteering may be used to position the drill bit or drill string of the drilling system (110) relative to a boundary between different subsurface layers (e.g., overlying, underlying, and lateral layers of a pay zone) during drilling operations. In particular, measuring rock properties during drilling may provide the drilling system (110) with the ability to steer the drill bit in the direction of desired hydrocarbon concentrations. As such, a geosteering system may use various sensors located inside or adjacent to the drill string to determine different rock formations within a well path. In some geosteering systems, drilling tools may use resistivity or acoustic measurements to guide the drill bit during horizontal or lateral drilling.

Returning to a reservoir simulator (160), a reservoir simulator (160) may include hardware and/or software with functionality for generating one or more machine-learning models (170) for use in analyzing the formation (106). For example, the reservoir simulator (160) may store well logs (140) and data regarding core samples (150), and further analyze the well log data, the core sample data, seismic data, and/or other types of data to generate and/or update one or more machine-learning models (170) and/or one or more geological models (175). Thus, different types of machine-learning models may be trained, such as convolutional neural networks, deep neural networks, recurrent neural networks, support vector machines, decision trees, inductive learning models, deductive learning models, supervised learning models, unsupervised learning models, reinforcement learning models, etc. In some embodiments, two or more different types of machine-learning models are integrated into a single machine-learning architecture, e.g., a machine-learning model may include decision trees and neural networks. In some embodiments, the reservoir simulator (160) may generate augmented or synthetic data to produce a large amount of interpreted data for training a particular model.

With respect to neural networks, for example, a neural network may include one or more hidden layers, where a hidden layer includes one or more neurons. A neuron may be a modelling node or object that is loosely patterned on a neuron of the human brain. In particular, a neuron may combine data inputs with a set of coefficients, i.e., a set of network weights for adjusting the data inputs. These network weights may amplify or reduce the value of a particular data input, thereby assigning an amount of significance to various data inputs for a task being modeled. Through machine learning, a neural network may determine which data inputs should receive greater priority in determining one or more specified outputs of the neural network. Likewise, these weighted data inputs may be summed such that this sum is communicated through a neuron's activation function to other hidden layers within the neural network. As such, the activation function may determine whether and to what extent an output of a neuron progresses to other neurons where the output may be weighted again for use as an input to the next hidden layer.

Returning to FIG. 1, a well path of a wellbore (104) may be updated by the control system (114) using a geological model (e.g., one of the geological models (175)). For example, a control system (114) may communicate geosteering commands to the drilling system (110) based on well data updates that are further adjusted by the reservoir simulator (160) using a geological model. As such, the control system (114) may generate one or more control signals for drilling equipment (or a logging system may generate for logging equipment) based on an updated well path design and/or a geological model.

While FIGS. 1, 2A, and 2B show various configurations of components, other configurations may be used without departing from the scope of the disclosure. For example, various components in FIGS. 1, 2A, and 2B may be combined to create a single component. As another example, the functionality performed by a single component may be performed by two or more components.

Figure 3:
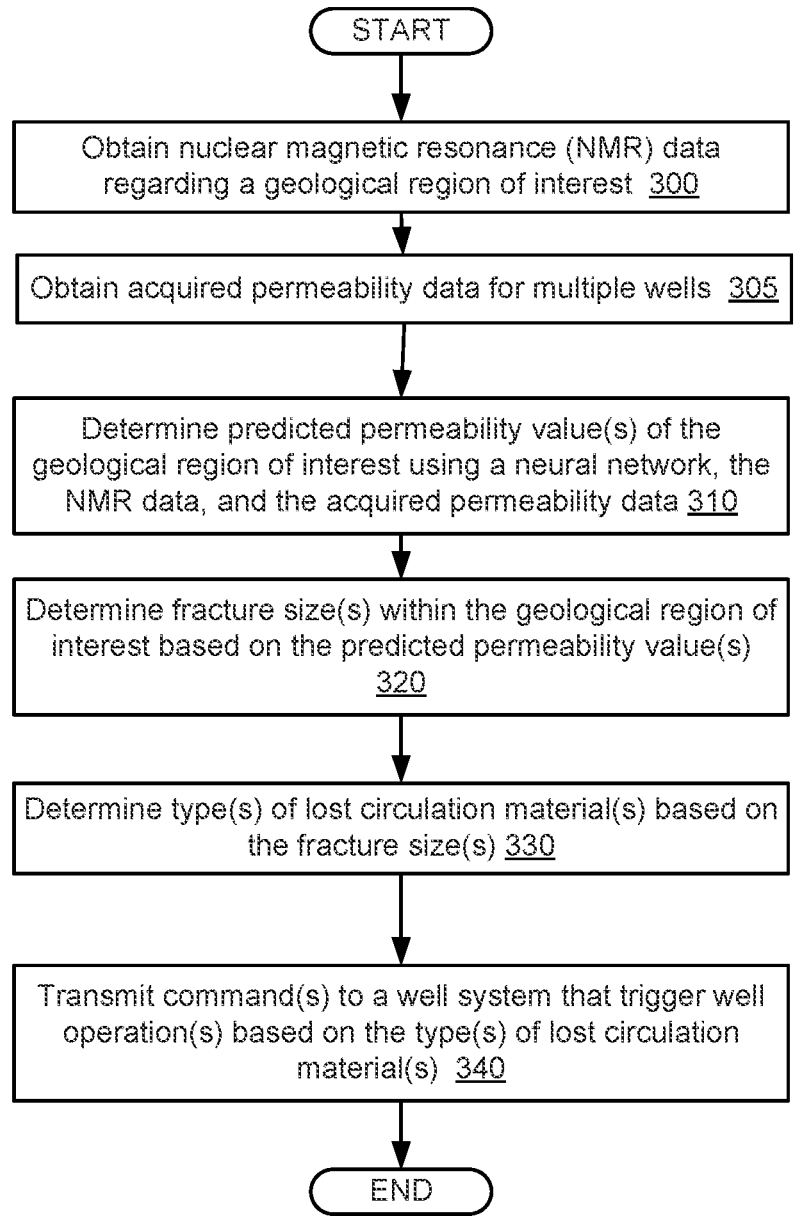
FIG. 3 shows a flowchart in accordance with one or more embodiments.

Turning to FIG. 3, FIG. 3 shows a flowchart in accordance with one or more embodiments. Specifically, FIG. 3 describes a general method for determining one or more LCM types based on predicted permeability data. One or more blocks in FIG. 3 may be performed by one or more components (e.g., reservoir simulator (160)) as described in FIGS. 1, 2A, and 2B. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 300, NMR data are obtained regarding a geological region of interest in accordance with one or more embodiments. The NMR data may be acquired using an NMR logging tool similar to the NMR logging tools described above in FIG. 1 and the accompanying description. For example, NMR logging tools may include magnetic resonance (MR) scanners and pulse NMR logging tools that generate a large, radially symmetric static magnetic field and a high-frequency oscillating magnetic field. Thus, NMR logging tools may be capable of penetrating one or more inches into a formation surrounding a wellbore. A geological region of interest may be a portion of a geological area or volume that includes one or more formations of interest desired or selected for analysis, e.g., for determining location of hydrocarbons or for reservoir development purposes. In particular, the geological region of interest may include multiple wells already drilled as well as locations of one or more wells planned for drilling.

In some embodiments, NMR data is organized according to various T2 signal parameters. For example, NMR data may be arranged in a database that includes single curve NMR data, an array of bound fluid volumes having different T2 cutoff values (e.g., 1 ms-3000 ms), an array describing different percentiles of T2 signal values, a T2 spectrum array (e.g., raw data from a service company), and/or T2 geometric mean values of the T2 signal.

In Block 305, acquired permeability data is obtained from multiple wells in accordance with one or more embodiments. For example, permeability data may be acquired from well logs in one or more wells and/or using core samples. In some embodiments, NMR data is also acquired that is associated with the same region as the acquired permeability data. In particular, the acquired permeability data may be obtained for various training wells and used to train a neural network for predicting permeability data for one or more wells without corresponding acquired permeability data.

In Block 310, one or more predicted permeability values are determined of a geological region of interest using a neural network, NMR data, and acquired permeability data in accordance with one or more embodiments. In some embodiments, for example, a neural network obtains NMR data at multiple T2 cutoff values and a ratio value of a free fluid index (FFI) over bound fluid irreducible (also called "bulk volume irreducible (BVI) of water") (e.g., the neural network may obtain T2 signal data corresponding to six time cutoff values of 10 ms, 33 ms, 100 ms, 316 ms, 1000 ms, and 3000 ms). In particular, the neural network may output predicted permeability data corresponding to pores with free fluids and a predetermined range of T2 cutoff values (e.g., between 10 ms and 3000 ms). In some embodiments, for example, BVI values and FFI values from training wells and the target well are inputs to a neural network. With respect to the ratio input values, the BVI values and the FFI values may be determined in a similar manner as described above in FIG. 1 regarding NMR logging and the accompanying description.

In some embodiments, a neural network obtains bound fluid volume (BFV) data as an input to determine predicted permeability data. For example, the BFV data may be an array of BFV values for different $T_2$ cutoff values, which may represent the amount of free fluid porosity. BFV data may be determined based on the sum of a BFI value and a value for clay bound water (e.g., Bound Fluid Irreducible (BVI)=Bound Fluid Volume (BFV)–Clay Bound Water (CBW)).

Figure 4A:
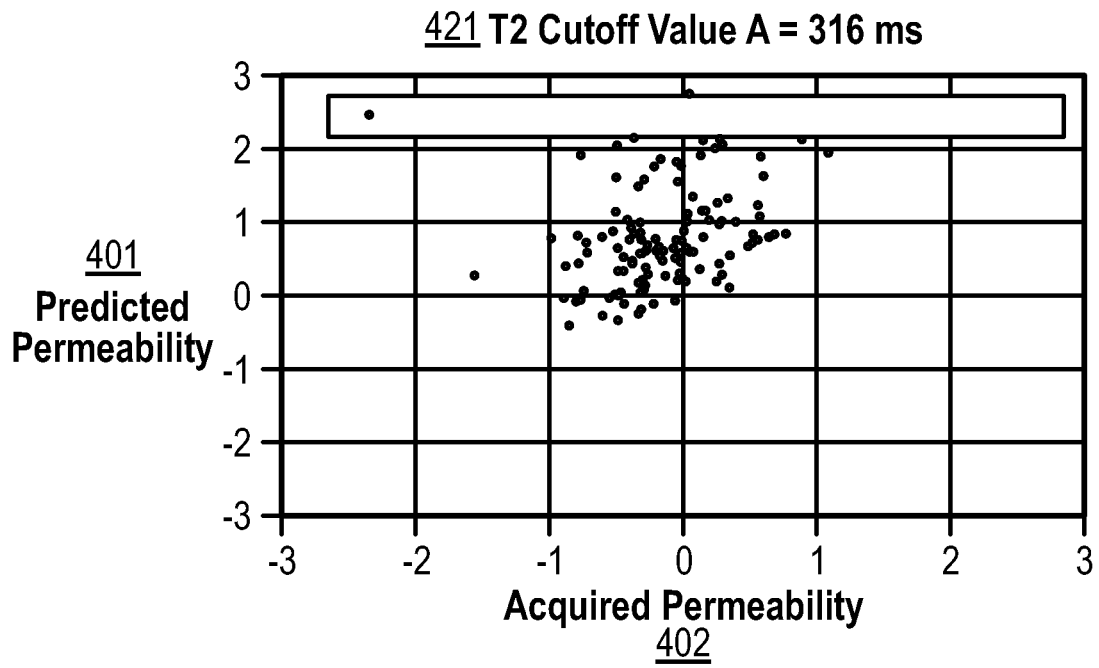
FIGS. 4A, 4B, 4C, 5A, and 5B show examples in accordance with one or more embodiments.
Figure 4B:
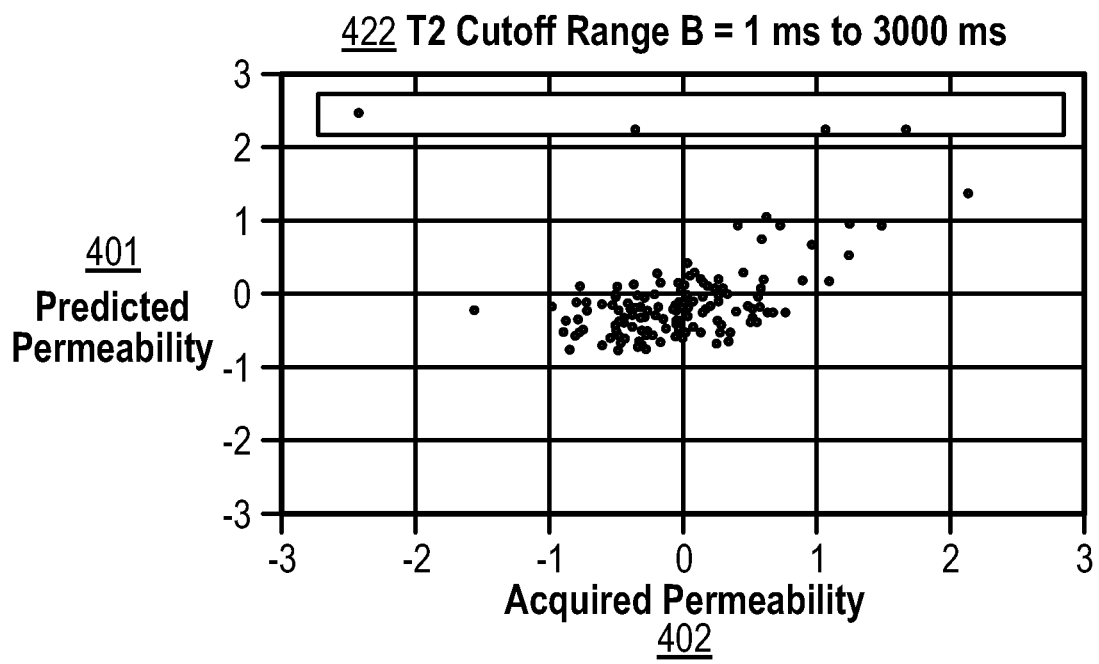
Figure 4C:
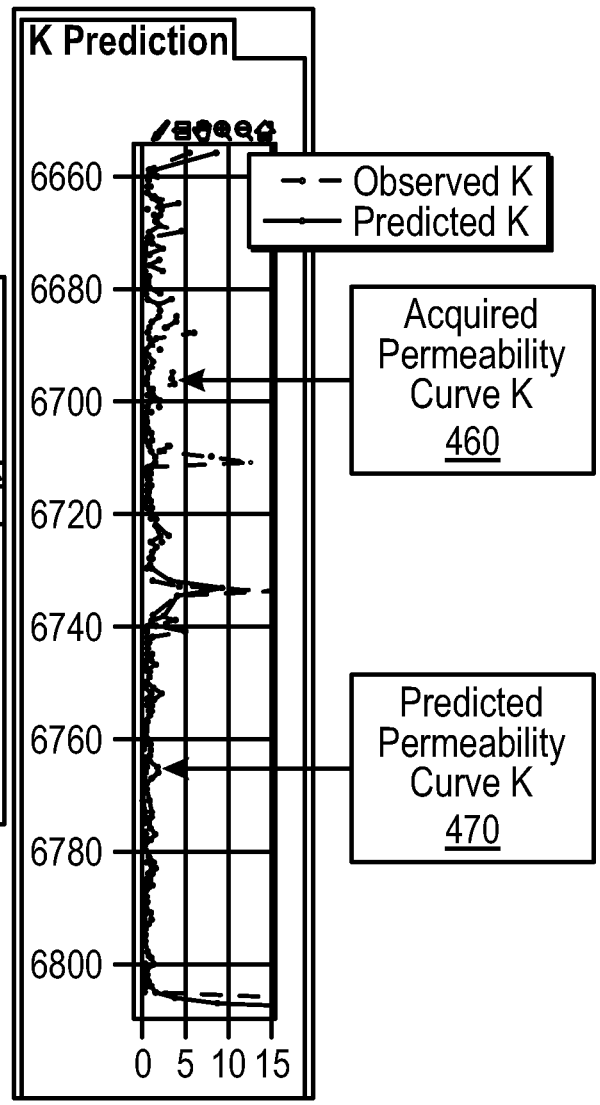

Turning to FIGS. 4A, 4B and 4C, FIGS. 4A, 4B and 4C provide examples of analyzing predicted permeability data with respect to acquired permeability data in accordance with one or more embodiments. The following examples are for explanatory purposes only and not intended to limit the scope of the disclosed technology.

Turning to FIGS. 4A and 4B, FIGS. 4A and 4B illustrate plots between acquired permeability data and predicted permeability data by a neural network using NMR data for various wells. As shown in FIGS. 4A-B, the y-axes correspond to predicted permeability (401) for various locations, while the x-axes correspond to acquired permeability (402), e.g., from core sample analysis or other logging techniques. For FIG. 4A, the T2 cutoff value A (421) is 316 ms, while FIG. 4B includes NMR data with T2 cutoff values ranging from 1 ms to 3000 ms. Moreover, the x-values and y-values in FIGS. 4A and 4B correspond to the amount of variance between the predicted and acquired data. Accordingly, as shown in FIG. 4B in contrast to FIG. 4A, permeability may be highly associated with higher multiple T2 cutoff values rather than a single T2 cutoff value used for FIG. 4A. Thus, a strong correlation may exist between a neural network's prediction and acquired permeability data for particular well for a T2 cutoff range B (422) with values between 1 ms and 3000 ms. In other words, the permeability values in FIG. 4B are symmetrically distributed and tend to cluster towards origin coordinates (0,0) of the plot. Moreover, the permeability values are clustered mostly around the lower x-axis [−0.5,0.5] and y-axis [−0.5,0.5] in FIG. 4B.

Turning to FIG. 4C, FIG. 4C shows an acquired permeability curve K (460) superimposed next to a predicted permeability curve K (470). Both curves (460, 470) are generated using a T2 cutoff value C (432) of 3162 ms, and produce a cross-correlation value A (431) of 91%. For determining the predicted permeability data in FIG. 4C, a neural network (not shown) uses total NMR porosity (441), BFV values (442), and Ratio Values (443) of FFI to BFV.

Returning to FIG. 3, in Block 320, one or more fractures sizes are determined within a geological region of interest based on one or more predicted permeability values in accordance with one or more embodiments. For example, a larger fracture size may correspond to a higher permeability value. In some embodiments, the fracture size is determined using numerical modeling of a leak-off test and available stress measurements. In particular, a leak-off test may test the fracture pressure of a particular formation, e.g., after cementing operations and/or drilling operations to verify that the casing, cement, and formation can withstand the pressure needed to safely drill the next section. The results of the leak-off test may determine the maximum pressure or mud weight that may be applied to a well during drilling operations. Likewise, different techniques may be used for determining different fracture sizes regarding natural fractures or drilling induced fractures in the geological region of interest.

In Block 330, one or more types of one or more lost circulation materials (LCMs) are determined based on one or more fracture sizes in accordance with one or more embodiments. For example, a reservoir simulator or a control system may use a real-time acquisition of NMR logging data to monitor well operations and address lost circulation events. Based on real-time fracture predictions based on predicted permeability data and fracture sizes, for example, a reservoir simulator or control system may determine specific drilling fluid properties to prevent or reduce a lost circulation event in a wellbore. Accordingly, one or more LCMs may be selected for addition or substitution to the current drilling fluid being used. For cementing operations, a similar process may be performed to address any lost circulation events that may occur.

In Block 340, one or more commands are transmitted to a well system that trigger one or more well operations based on one or more types of one or more lost circulation materials in accordance with one or more embodiments. For example, a command may be fashioned correspond to a particular parameter value for a selected LCM. Thus, the command may be a control signal, e.g., generated by a control system, or a network message that adjusts one or more drilling fluid parameters and/or cementing parameters. For example, a command may be transmitted from a reservoir simulator or control system at a well site to one or more drilling systems, such as an automated mud processing system. The drilling system may be similar to the drilling system (110) described above in FIG. 1 and the accompanying description.

In regard to automated mud processing systems, an automated mud processing system may include a controller coupled various feeders, various control valves, various mixing tanks, and/or a solid removal system for managing drilling fluid in a drilling operation. The controller may include hardware, such as a processor, coupled to various sensors around various well systems at a well site. With respect to a mixing tank, a mixing tank may be a container or other type of receptacle (e.g., a mud pit) for mixing various liquids, fresh mud, recycled mud, different types of LCMs, additives, and/or other chemicals to produce a particular drilling fluid mixture. For example, a mixing tank may be coupled to one or more mud supply tanks, one or more additive supply tanks, one or more dry/wet feeders, and one or more control valves for managing the mixing of chemicals within a respective mixing tank. Control valves may be used to meter chemical inputs into a mixing tank, as well as release drilling fluid into a mixing tank.

Figure 5A:
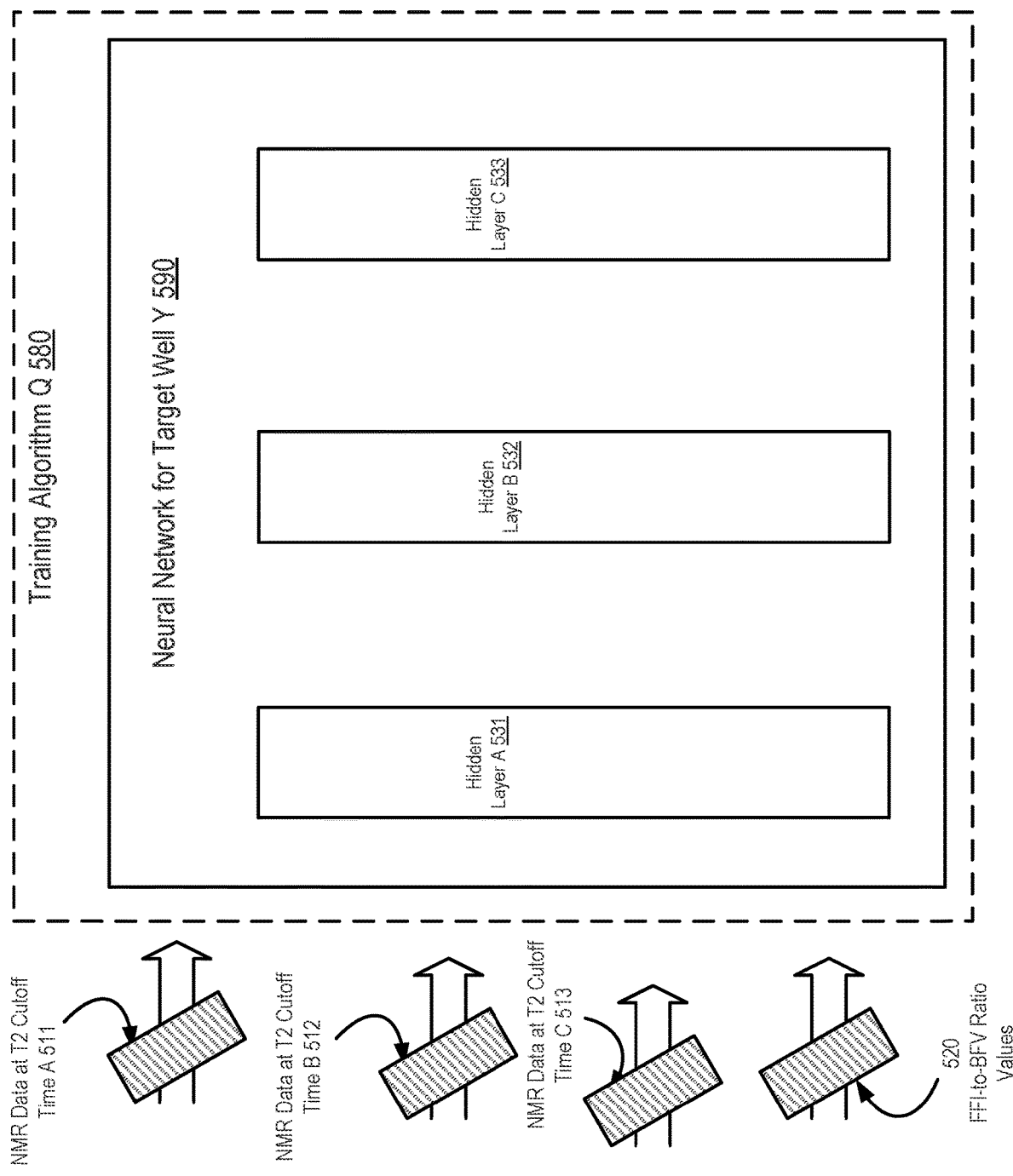
Figure 5B:
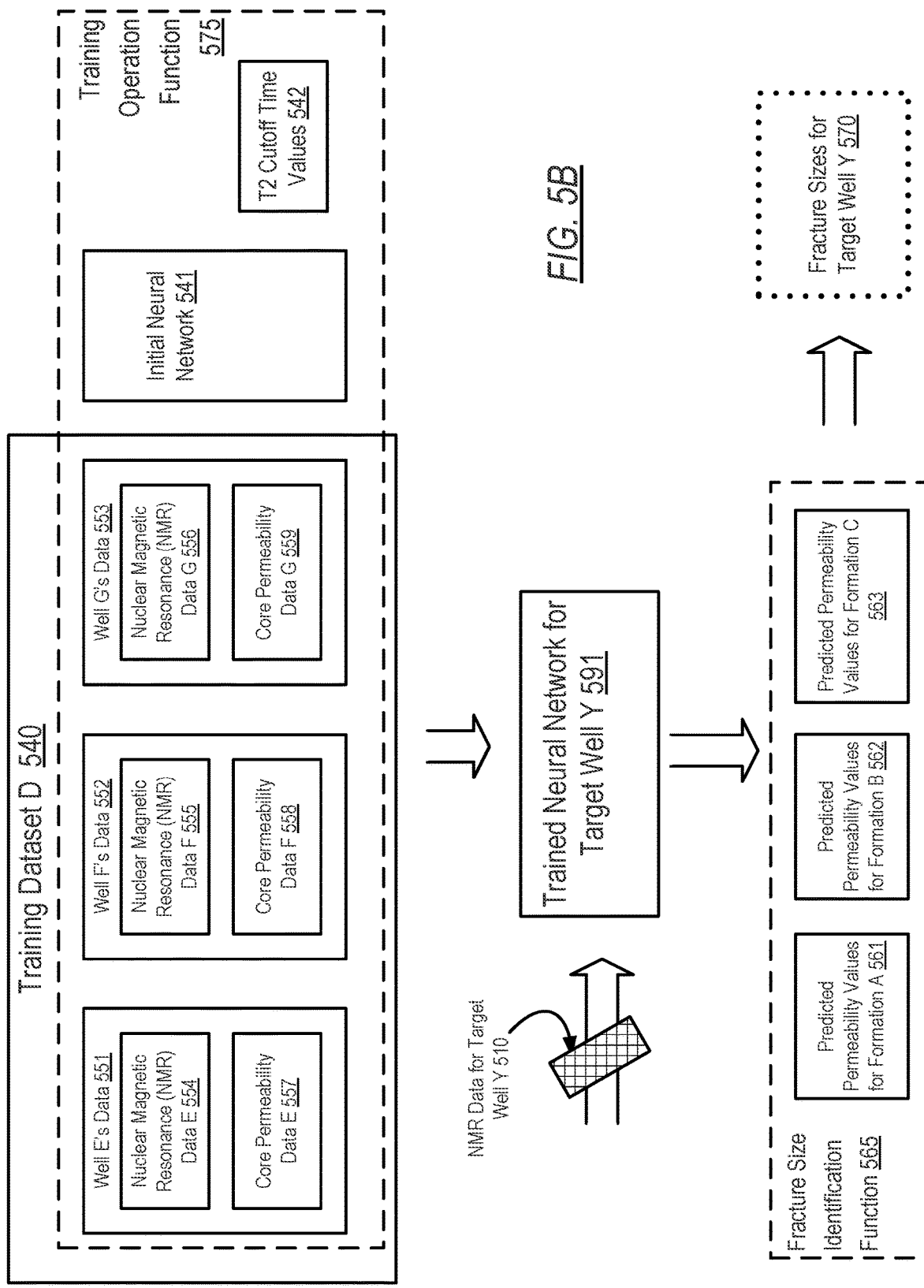

Turning to FIGS. 5A and 5B, FIGS. 5A and 5B provide example of using neural networks for predicting permeability data in accordance with one or more embodiments. In FIG. 5A, a neural network (590) for a target well Y that is trained using a training algorithm Q (580). In particular, NMR data and known permeability data from several training wells for similar geological regions as target well Y may be used to train the neural network (590). For example, neural network parameters may be adjusted until the predicted permeability data for the training wells is within a predetermined cross-correlation with the known permeability data of the training wells (i.e., the testing data). The training algorithm may be a machine-learning algorithm that uses supervised learning, such as stochastic gradient descent (SGD) or a variant of SGD. For example, the neural network (590) may be a forward model that uses backpropagation and gradients for updating the neural network (590). However, other training algorithms are contemplated, such as the training algorithm described below in FIG. 6 and the accompanying description.

Keeping with FIG. 5A, the neural network (590) includes three hidden layers (i.e., hidden layer A (531), hidden layer B (532), hidden layer C (533)), an input layer, and an output layer. Likewise, the neural network (590) obtains several feature inputs from target well Y at the input layer, i.e., NMR data (511) at a T2 cutoff time A, NMR data (512) at a T2 cutoff time B, NMR data (513) at a T2 cutoff time C, and FFI-to-BFV ratio values (520) corresponding to time A, time B, and time C. At the output layer, predicted permeability data Y (585) is obtained for target well Y.

Turning to FIG. 5B, FIG. 5B shows a training dataset D (540) that is used to perform a training operation of an initial neural network (541) for a target well Y using a training operation function (575). The training dataset D (540) includes data from various training wells, i.e., well E's data (551), well F's data (552), and Well G's data (553). The training dataset D (540) further includes NMR data (i.e., NMR data E (554), NMR data F (555), NMR data G (556)) and core permeability data (i.e., core permeability data E (557), core permeability data F (558), core permeability data G (559)). For the training operation, various T2 cutoff values (542) are also selected for determining FFI values, BVI values, and ratio values of FFI-to-BVI from the NMR data (554, 555, 556). The T2 cutoff values may be automatically selected by a reservoir simulator, e.g., using a table of T2 cutoff values associated with different types of formations, or by a user selection using a user device.

After the training operation function (575) is applied to the training dataset D (540) and the initial neural network (541), a trained neural network (591) for target well Y is output for inference operations. Accordingly, NMR data (510) for target well Y is input to the trained neural network (591) to generate predicted permeability data for multiple formations proximate target well Y (i.e., predicted permeability values for formation A (561), predicted permeability values for formation B (562), predicted permeability values for formation C (563)). As such, a reservoir simulator may use a fracture size identification function (565) to the predicted permeability values (561, 562, 563) to generate various fracture sizes (570) for target well Y.

Figure 6:
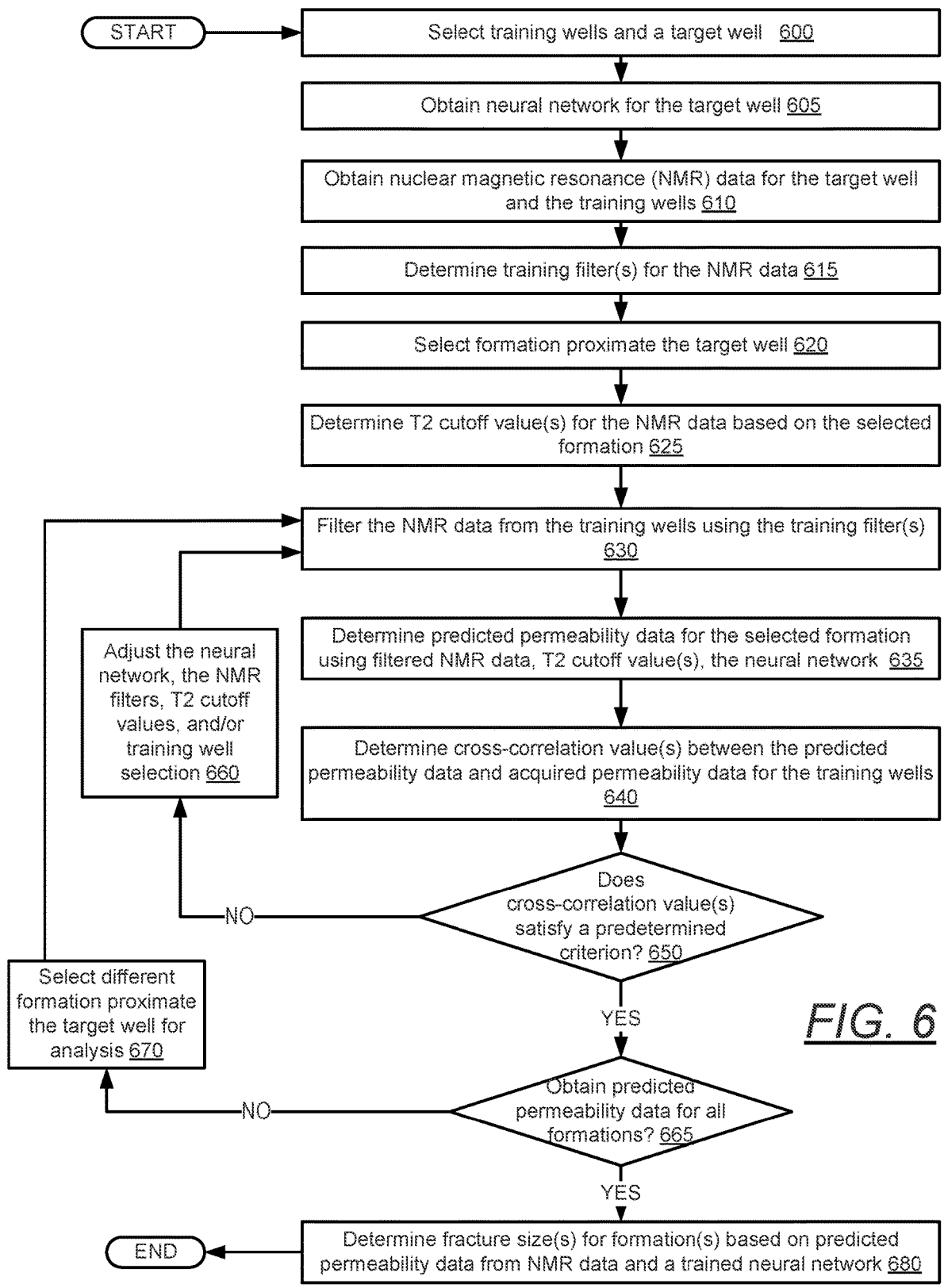
FIG. 6 shows a flowchart in accordance with one or more embodiments.

Turning to FIG. 6, FIG. 6 shows a flowchart in accordance with one or more embodiments. Specifically, FIG. 6 describes a specific method for training a neural network using various training wells. One or more blocks in FIG. 6 may be performed by one or more components (e.g., reservoir simulation (160)) as described in FIGS. 1, 2A, and/or 2B. While the various blocks in FIG. 6 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 600, various training wells and a target well are selected in accordance with one or more embodiments. More specifically, a target well may have similar NMR data as the training wells, but a reservoir simulator may not have core permeability data or other acquired permeability data for the target well. On the other hand, training wells may be nearby wells to the target wells or merely wells with similar geological characteristics (e.g., common types of formations, similar types of reservoirs, etc.). Likewise, the target well and the training wells may correspond to a user selection using a user device coupled to a reservoir simulator. The user selection may be obtained from a user interface on a user device, a reservoir simulator, a human-machine interface (HMI), etc. In some embodiments, a reservoir simulator may analyze NMR data for a target well in order to automatically select various training wells for a training operation. The target well and/or training wells may be identified in a request to a reservoir simulator to generate a trained neural network using a training operation.

In Block 605, a neural network is obtained for a target well in accordance with one or more embodiments. For example, a neural network may be initialized with various activation functions, weights, hyperparameters, etc. Likewise, the neural network may be a pretrained prior to initiating the process described in FIG. 6, e.g., a default neural network model may be pretained for predicting permeability data from NMR data. In some embodiments, for example, the neural network is similar to neural networks described above in FIG. 1 and the accompanying description.

In Block 610, NMR data is obtained for a target well and various training wells in accordance with one or more embodiments. In particular, the NMR data may be a portion of a training dataset that is split into several batches that include NMR data and core permeability data for the training wells. Thus, training data may be organized for a training operation automatically by a reservoir simulator, or through various training parameters implemented by a user with a user interface. As such, Blocks 630-660 may correspond to various machine-learning epochs iterated in order to perform a training operation.

In Block 615, one or more training filters are determined in accordance with one or more embodiments. After training data and the target well's data are loaded into a reservoir simulator, for example, data may be further filtered using various training filters that correspond to different formation types, geological characteristics (e.g., grain density, porosity values, permeability values, NMR T2 geometric mean values), etc., in order to produce a dataset with characteristics similar to the target well's data. In some embodiments, a user device may provide one or more filter ranges for a particular training filter that is used to automatically filter the training data and the target well's data. For example, a user may select various filter ranges for respective training filters using a user interface provide by a user device.

Turning to FIGS. 7A and 7B, FIGS. 7A and 7B show a user interface (700) in accordance with some embodiments. In particular, the user interface (700) may be located on a reservoir simulator, a user device, such as a human-machine interface (HMI) that communicates with a reservoir simulator, or another device at a well site or remote from the well site. The user interface (700) may provide a graphical user interface for selecting one or more training parameters as described above in Blocks 600, 610, and 615 and below in Blocks 620, 625, and 660. Training parameters may include, for example, training dataset files (701), training filters (702), the formation (703), T2 cutoff values (704), training wells (i.e., training well selection (705)), and model parameters relating to a neural network. Throughout a training operation, a user may adjust the training parameters, e.g., the T2 cutoff values, based on different formation types being carbonate or sandstone formations until a satisfactory prediction quality is obtained by the training operation.

Returning to FIG. 6, in Block 620, a target formation proximate a target well is selected in accordance with one or more embodiments. For example, a reservoir simulator may automatically determine (e.g., using other well log data or core data) for available formations within the training wells and the target well.

In Block 625, one or more T2 cutoff values are determine for NMR data based on a target formation in accordance with one or more embodiments. For example, a T2 cutoff selection may be obtained by a user device (e.g., personal computer, human machine interface, etc.) in response to a user input. This T2 cutoff selection may correspond to multiple T2 cutoff values for determining NMR inputs to a neural network. Throughout a training operation, this T2 cutoff selection may be adjusted automatically by a reservoir simulator (e.g., based on a search algorithm or a cross-correlation value) or by additional user inputs. Thus, T2 cutoff values may be adjusted accordingly (e.g., to produce adjusted T2 cutoff values).

In Block 630, NMR from various training wells is filtered using one or more training filters in accordance with one or more embodiments. Accordingly, filtered data may be used throughout the training operation in order to tailor data from the training wells to the target well. Likewise, different training filters may be used in different iterations of a training operation to fine tune the training data for training the neural network.

In Block 635, predicted permeability data for a selected formation is determined using filtered NMR data, one or more T2 cutoff values, and a neural network in accordance with one or more embodiments. The predicted permeability data may be determined using similar techniques as described above in Block 310, FIGS. 4A-4C, 5A, and 5B, and the accompanying description.

In Block 640, one or more cross-correlation values are determined between predicted permeability data and acquired permeability data for various training wells in accordance with one or more embodiments.

In Block 650, a determination is made whether one or more cross-correlation values satisfy a predetermined criterion in accordance with one or more embodiments. For example, a predetermined criterion may correspond to a target correlation value. Likewise, changes in cross-correlation values may be analyzed for detecting a local minimum or a global minimum for a training operation. Where one or more cross-correlation values fails to satisfy a predetermined criterion, the process may proceed to Block 660. Where the predetermined criterion is satisfied, the process may proceed to Block 665.

In Block 660, a neural network, one or more training filters, one or more T2 cutoff values, and/or a training well selection are adjusted in accordance with one or more embodiments. Based on the previous cross-correlation values, a reservoir simulator may automatically modify one or more training parameters in order to increase the cross-correlation value. For example, new training wells may be added to a training well selection for a next iteration of a training operation, and/or previous training wells may be excluded from the next iteration. Likewise, users may change particular values (e.g., through a user interface) based on their geological knowledge, e.g., with respect to possible T2 cutoff selection or training filters. Likewise, the training well selection may be modified in several iterations in order to analyze changes in cross-correlation values.

In Block 665, a determination is made whether predicted permeability data is obtained for all formations in accordance with one or more embodiments. For example, the training operation may iteratively analyze each formation associated with the target well until the predetermined criterion is satisfied for each formation. Thus, a training operation may be divided into training for different formations rather than simply training based on different batches of training data. Where another formation needs to be analyzed for the target well, the process may proceed to Block 670. Where all formations for the target well have been analyzed, the process may proceed to Block 680.

In Block 670, a different target formation proximate a target well is selected for analysis in accordance with one or more embodiments. For example, the different formations may be stored in a list which are analyzed consecutively. On the other hand, a user may specify the next formation selection in the training operation.

In Block 680, one or more fracture sizes for one or more formations are determined based on predicted permeability data from NMR data and a trained neural network in accordance with one or more embodiments. Once the predicted permeability reaches an accuracy of 0.9, for example, fracture sizes for various formations may be determined using predicted permeability data. The size of fractures may be a useful tool for optimizing the selection of LCMs as described above in Blocks 330 and 340.

Figure 8:
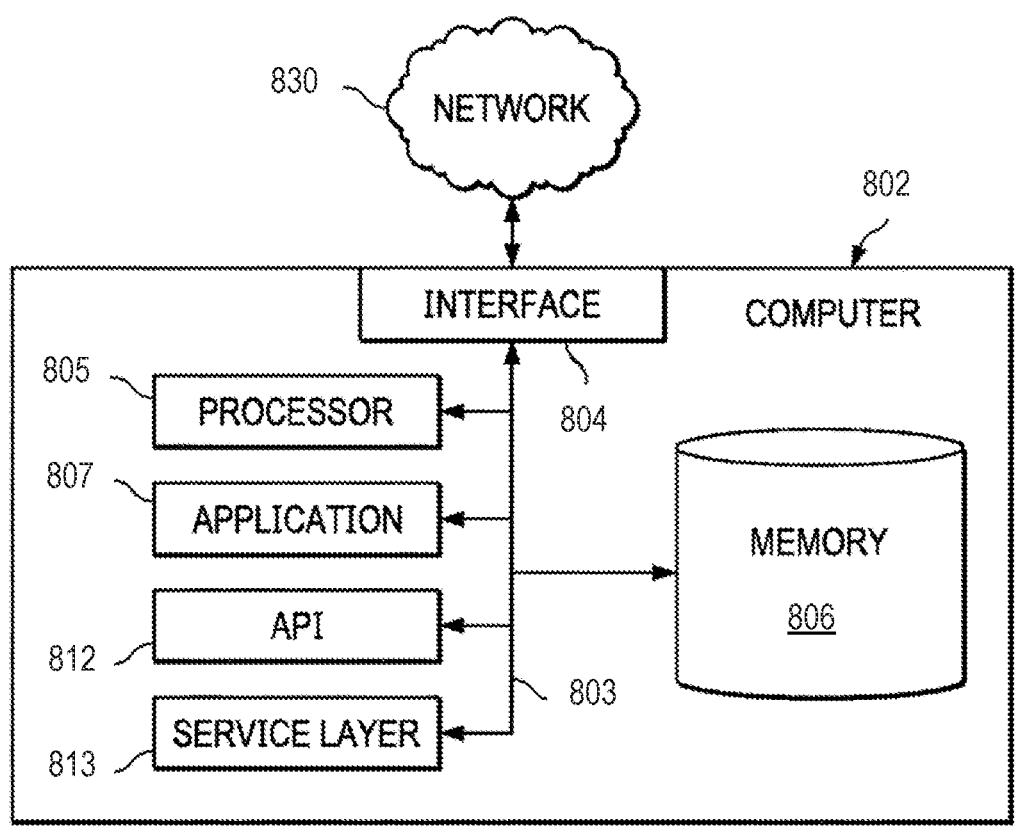
FIG. 8 shows a computer system in accordance with one or more embodiments.

Embodiments may be implemented on a computer system. FIG. 8 is a block diagram of a computer system (802) used to provide computational functionalities associated with described algorithms, methods, functions, processes, flows, and procedures as described in the instant disclosure, according to an implementation. The illustrated computer (802) is intended to encompass any computing device such as a high performance computing (HPC) device, a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (802) may include a computer that includes an input device, such as a keypad, keyboard, touch screen, or other device that can accept user information, and an output device that conveys information associated with the operation of the computer (802), including digital data, visual, or audio information (or a combination of information), or a GUI.

The computer (802) can serve in a role as a client, network component, a server, a database or other persistency, or any other component (or a combination of roles) of a computer system for performing the subject matter described in the instant disclosure. The illustrated computer (802) is communicably coupled with a network (830). In some implementations, one or more components of the computer (802) may be configured to operate within environments, including cloud-computing-based, local, global, or other environment (or a combination of environments).

At a high level, the computer (802) is an electronic computing device operable to receive, transmit, process, store, or manage data and information associated with the described subject matter. According to some implementations, the computer (802) may also include or be communicably coupled with an application server, e-mail server, web server, caching server, streaming data server, business intelligence (BI) server, or other server (or a combination of servers).

The computer (802) can receive requests over network (830) from a client application (for example, executing on another computer (802)) and responding to the received requests by processing the said requests in an appropriate software application. In addition, requests may also be sent to the computer (802) from internal users (for example, from a command console or by other appropriate access method), external or third-parties, other automated applications, as well as any other appropriate entities, individuals, systems, or computers.

Each of the components of the computer (802) can communicate using a system bus (803). In some implementations, any or all of the components of the computer (802), both hardware or software (or a combination of hardware and software), may interface with each other or the interface (804) (or a combination of both) over the system bus (803) using an application programming interface (API) (812) or a service layer (813) (or a combination of the API (812) and service layer (813). The API (812) may include specifications for routines, data structures, and object classes. The API (812) may be either computer-language independent or dependent and refer to a complete interface, a single function, or even a set of APIs. The service layer (813) provides software services to the computer (802) or other components (whether or not illustrated) that are communicably coupled to the computer (802). The functionality of the computer (802) may be accessible for all service consumers using this service layer. Software services, such as those provided by the service layer (813), provide reusable, defined business functionalities through a defined interface. For example, the interface may be software written in JAVA, C++, or other suitable language providing data in extensible markup language (XML) format or other suitable format. While illustrated as an integrated component of the computer (802), alternative implementations may illustrate the API (812) or the service layer (813) as stand-alone components in relation to other components of the computer (802) or other components (whether or not illustrated) that are communicably coupled to the computer (802). Moreover, any or all parts of the API (812) or the service layer (813) may be implemented as child or sub-modules of another software module, enterprise application, or hardware module without departing from the scope of this disclosure.

The computer (802) includes an interface (804). Although illustrated as a single interface (804) in FIG. 8, two or more interfaces (804) may be used according to particular needs, desires, or particular implementations of the computer (802). The interface (804) is used by the computer (802) for communicating with other systems in a distributed environment that are connected to the network (830). Generally, the interface (804 includes logic encoded in software or hardware (or a combination of software and hardware) and operable to communicate with the network (830). More specifically, the interface (804) may include software supporting one or more communication protocols associated with communications such that the network (830) or interface's hardware is operable to communicate physical signals within and outside of the illustrated computer (802).

The computer (802) includes at least one computer processor (805). Although illustrated as a single computer processor (805) in FIG. 8, two or more processors may be used according to particular needs, desires, or particular implementations of the computer (802). Generally, the computer processor (805) executes instructions and manipulates data to perform the operations of the computer (802) and any algorithms, methods, functions, processes, flows, and procedures as described in the instant disclosure.

The computer (802) also includes a memory (806) that holds data for the computer (802) or other components (or a combination of both) that can be connected to the network (830). For example, memory (806) can be a database storing data consistent with this disclosure. Although illustrated as a single memory (806) in FIG. 8, two or more memories may be used according to particular needs, desires, or particular implementations of the computer (802) and the described functionality. While memory (806) is illustrated as an integral component of the computer (802), in alternative implementations, memory (806) can be external to the computer (802).

The application (807) is an algorithmic software engine providing functionality according to particular needs, desires, or particular implementations of the computer (802), particularly with respect to functionality described in this disclosure. For example, application (807) can serve as one or more components, modules, applications, etc. Further, although illustrated as a single application (807), the application (807) may be implemented as multiple applications (807) on the computer (802). In addition, although illustrated as integral to the computer (802), in alternative implementations, the application (807) can be external to the computer (802).

There may be any number of computers (802) associated with, or external to, a computer system containing computer (802), each computer (802) communicating over network (830). Further, the term "client," "user," and other appropriate terminology may be used interchangeably as appropriate without departing from the scope of this disclosure. Moreover, this disclosure contemplates that many users may use one computer (802), or that one user may use multiple computers (802).

In some embodiments, the computer (802) is implemented as part of a cloud computing system. For example, a cloud computing system may include one or more remote servers along with various other cloud components, such as cloud storage units and edge servers. In particular, a cloud computing system may perform one or more computing operations without direct active management by a user device or local computer system. As such, a cloud computing system may have different functions distributed over multiple locations from a central server, which may be performed using one or more Internet connections. More specifically, cloud computing system may operate according to one or more service models, such as infrastructure as a service (IaaS), platform as a service (PaaS), software as a service (SaaS), mobile "backend" as a service (MBaaS), serverless computing, artificial intelligence (AI) as a service (AIaaS), and/or function as a service (FaaS).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed:

1. A method, comprising:
    acquiring, with a Magnetic Resonance (MR) scanner or a pulse Nuclear Magnetic Resonance (NMR) logging tool that generates a magnetic field and measures a presence of protons in the magnetic field, first NMR data and permeability data regarding a geological region of interest;
    wherein the first NMR data is organized according to one or more T2 signal parameters,
    obtaining a plurality of ratio values of free fluids volume index (FFI) over bound fluids volumes (BFV) regarding the geological region of interest;
    wherein the values of BFV are is determined based on the sum of a BFI value and a value for clay bound water, wherein the plurality of ratio values comprises bulk volume irreducible (BVI) values and FFI values from training wells and a target well;

obtaining, by a computer processor, the acquired first NMR data and the acquired permeability data regarding the geological region of interest;

determining, by the computer processor using the plurality of ratio values, and using a neural network and second NMR data, first predicted permeability data regarding a predetermined formation within the geological region of interest, wherein the neural network is trained using the first NMR data and the acquired permeability data;

determining, by the computer processor, a predetermined fracture size within the predetermined formation based on the first predicted permeability data;

determining, by the computer processor, a predetermined type of lost circulation material (LCM) based on the predetermined fracture size;

transmitting, by the computer processor, a command to a well system that triggers a well operation using the predetermined type of LCM, wherein the well operation is a drilling operation that supplies a drilling fluid with a predetermined LCM material into a wellbore coupled to the well system, and wherein the predetermined LCM material corresponds to the predetermined type of LCM, determining a training filter based on one or more geological parameters, wherein the one or more geological parameters correspond to a predetermined grain density, a predetermined core porosity, a predetermined core permeability, or a predetermined NMR porosity;

wherein the training filter comprises one or more filter ranges configured to filter NMR data from training wells and the target well, and determining filtered NMR data using the training filter and the first NMR data, where the neural network is trained using the filtered NMR data.

2. The method of claim 1, further comprising:

obtaining, from a user device, a selection of a target formation among a plurality of formations in the geological region of interest;

determining, using the neural network, second predicted permeability data for the target formation based on second NMR data and a plurality of T2 cutoff values;

adjusting, based on a T2 cutoff selection by the user device, the plurality of T2 cutoff values to produce a plurality of adjusted T2 cutoff values; and determining third predicted permeability based on the plurality of adjusted T2 cutoff values and the second NMR data.

3. The method of claim 1, wherein the LCM material is selected from a group consisting of:

a fibrous material;
a flaky material; and
a granular material.

4. The method of claim 1, wherein the neural network is updated iteratively during one or more training operations until a predetermined criterion is satisfied, wherein the predetermined criterion is a cross-correlation value between second predicted permeability data from the geological region of interest and the acquired permeability data.

5. A method, comprising:

acquiring, with a Magnetic Resonance (MR) scanner or a pulse Nuclear Magnetic Resonance (NMR) logging tool that generates a magnetic field and measures a presence of protons in the magnetic field, first NMR data and permeability data regarding a geological region of interest;

wherein the first NMR data is organized according to one or more T2 signal parameters, obtaining a plurality of ratio values of free fluids volume index (FFI) over bound fluids volumes (BFV) regarding the plurality of training wells;

wherein the BFV data is determined based on a sum of a BFI value and a value for clay bound water;

wherein the plurality of ratio values comprises bulk volume irreducible (BVI) values and FFI values from training wells and a target well;

obtaining, using a computer processor, the first nuclear magnetic resonance (NMR) data for the target well and second NMR data for a plurality of training wells;

obtaining, using the computer processor and the plurality of ratio values, first acquired permeability data for the plurality of training wells, wherein the first acquired permeability data is acquired using core samples from the plurality of training wells;

determining, using the computer processor, a neural network, and the second NMR data, first predicted permeability data for the target well;

updating, using the computer processor, the neural network based on a difference between the first predicted permeability data and the first acquired permeability data, wherein the neural network is updated to produce a trained neural network by adjusting one or more T2 cutoff values regarding the first NMR data and the second NMR data for different formations;

transmitting, by the computer processor, a command to a well system that triggers a well operation using the predetermined type of LCM, wherein the well operation is a drilling operation that supplies a drilling fluid with a predetermined LCM material into a wellbore coupled to the well system, and wherein the predetermined LCM material corresponds to the predetermined type of LCM, determining a training filter based on one or more geological parameters, wherein the one or more geological parameters correspond to a predetermined grain density, a predetermined core porosity, a predetermined core permeability, or a predetermined NMR porosity;

wherein the training filter comprises one or more filter ranges configured to filter NMR data from training wells and the target well, and determining filtered NMR data using the training filter and the first NMR data, where the neural network is trained using the filtered NMR data.

6. The method of claim 5, further comprising:

determining whether the difference between the first predicted permeability data and the first acquired permeability data satisfies a predetermined criterion; and performing, in response to the difference failing to satisfy the predetermined criterion and iteratively using a plurality of machine-learning epochs, a plurality of updates to the neural network until the predetermined criterion is satisfied.

7. The method of claim 6, wherein the predetermined criterion is a cross-correlation threshold.

8. The method of claim 5, further comprising:

adjusting, in response to the difference between the first predicted permeability data and the first acquired permeability data being more than a predetermined criterion, the plurality of training wells to produce a plurality of adjusted training wells, wherein one or more training wells among the plurality of training wells is excluded from the plurality of adjusted training wells, wherein the neural network determines second predicted permeability data using third NMR data from the plurality of adjusted training wells.

9. A system, comprising:

a logging system coupled to a Magnetic Resonance (MR) scanner or a pulse Nuclear Magnetic Resonance (NMR) logging tool that is configured to generate a magnetic field and measure a presence of protons in the magnetic field;

a well system coupled to the logging system and a wellbore; and a reservoir simulator comprising a computer processor, wherein the reservoir simulator is coupled to the logging system and the well system, the reservoir simulator comprising functionality for:

obtaining, by the MR scanner or the NMR logging tool, first NMR data regarding a geological region of interest;

wherein the first NMR data is organized according to one or more T2 signal parameters, obtaining a plurality of ratio values of free fluids volume index (FFI) over bound fluids volumes (BFV) regarding the geological region of interest;

wherein the BFV data is determined based on a sum of a BFI value and a value for clay bound water;

determining, by the computer processor using the plurality of ratio values, and using a neural network and the first NMR data, first predicted permeability data regarding a predetermined formation within the geological region of interest, wherein the neural network is trained using second NMR data and acquired permeability data regarding the geological region of interest;

wherein the plurality of ratio values comprises bulk volume irreducible (BVI) values and FFI values from training wells and a target well;

determining a predetermined fracture size within the predetermined formation based on the first predicted permeability data;

determining a predetermined type of lost circulation material (LCM) based on the predetermined fracture size; and transmitting a command to the well system that triggers a well operation using the predetermined type of LCM, wherein the well operation is a drilling operation that supplies a drilling fluid with a predetermined LCM material into a wellbore coupled to the well system, and wherein the predetermined LCM material corresponds to the predetermined type of LCM, determining a training filter based on one or more geological parameters, wherein the one or more geological parameters correspond to a predetermined grain density, a predetermined core porosity, a predetermined core permeability, or a predetermined NMR porosity;

wherein the training filter comprises one or more filter ranges configured to filter NMR data from training wells and the target well, and determining filtered NMR data using the training filter and the first NMR data, where the neural network is trained using the filtered NMR data.

10. The system of claim 9, wherein the reservoir simulator further comprises functionality for:

determining whether a difference between second predicted permeability data based on the second NMR data and the acquired permeability data satisfies a predetermined criterion; and performing, in response to the difference failing to satisfy the predetermined criterion and iteratively using a plurality of machine-learning epochs, a plurality of updates to the neural network until the predetermined criterion is satisfied, wherein the predetermined criterion is a cross-correlation threshold.

11. The system of claim 9, wherein the well system is a drilling system that supplies a drilling fluid with a predetermined LCM material into the wellbore, and wherein the predetermined LCM material corresponds to the predetermined type of LCM.

12. The system of claim 9, wherein the well system is a cementing system that supplies a cement slurry with a predetermined LCM material into the wellbore, and wherein the predetermined LCM material corresponds to the predetermined type of LCM.

13. The system of claim 9, wherein the acquired permeability data is obtained by analyzing one or more core samples acquired using a coring tool.

14. The system of claim 9, further comprising:

a user device coupled to the reservoir simulation, wherein the user device is configured to transmit a training well selection and a T2 cutoff selection to the reservoir simulator in response to a user input within a graphical user interface that is displayed by the user device.

15. The system of claim 9, further comprising:

a control system coupled to the reservoir simulator; and a mud processing system coupled to the well system and a control system, wherein the mud processing system supplies the LCM material to a drilling fluid produced by the well system in response to a command from the control system.

* * * * *